United States Patent
Odaka et al.

(10) Patent No.: US 9,831,391 B2
(45) Date of Patent: Nov. 28, 2017

(54) LIGHT EMITTING DISPLAY DEVICE AND MANUFACTURING METHOD OF THE LIGHT EMITTING DISPLAY DEVICE

(71) Applicant: Japan Display Inc., Tokyo (JP)

(72) Inventors: Kazuhiro Odaka, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 78 days.

(21) Appl. No.: 14/547,169

(22) Filed: Nov. 19, 2014

(65) Prior Publication Data

US 2015/0144977 A1    May 28, 2015

(30) Foreign Application Priority Data

Nov. 27, 2013  (JP) .................................. 2013-245394

(51) Int. Cl.
| | |
|---|---|
| *H01L 33/44* | (2010.01) |
| *H01L 33/38* | (2010.01) |
| *H01L 33/62* | (2010.01) |
| *H01L 27/32* | (2006.01) |

(52) U.S. Cl.
CPC .......... *H01L 33/44* (2013.01); *H01L 27/3246* (2013.01); *H01L 27/3276* (2013.01)

(58) Field of Classification Search
CPC .......... H01L 33/44; H01L 33/38; H01L 33/62
USPC .......................................................... 257/98
See application file for complete search history.

(56) References Cited

U.S. PATENT DOCUMENTS

| | | | |
|---|---|---|---|
| 2001/0026257 A1 | 10/2001 | Kimura | |
| 2003/0169242 A1* | 9/2003 | Nakanishi | H01L 27/3223 345/204 |
| 2010/0259467 A1* | 10/2010 | Su | H01L 27/3276 345/76 |
| 2011/0059606 A1* | 3/2011 | Bekku | G03F 1/144 438/613 |

(Continued)

FOREIGN PATENT DOCUMENTS

| | | |
|---|---|---|
| JP | 2003-288987 A | 10/2003 |
| JP | 2007-304394 A | 11/2007 |

(Continued)

OTHER PUBLICATIONS

Japanese Office Action dated May 9, 2017 for corresponding JP Patent Application No. 2013-245394, With Translation.

*Primary Examiner* — Fernando L Toledo
*Assistant Examiner* — Lawrence-Linh T Nguyen
(74) *Attorney, Agent, or Firm* — Typha IP PLLC

(57) ABSTRACT

The present invention aims to control power consumption of a light emitting display device by reducing parasitic capacitance between wires in a drive circuit part of a periphery region. The light emitting display device of the present invention includes an insulation film arranged above a substrate, a first wiring arranged above the insulation film in a pixel region, a second wiring arranged above the insulation film in a periphery region of a periphery of the pixel region, a common electrode continuously arranged to the pixel region and the periphery region, a first insulation layer arranged between the first wiring and the common electrode, and a second insulation layer arranged between the second wiring and the common electrode and having a larger thickness than the first insulation layer.

19 Claims, 22 Drawing Sheets

(56) References Cited

U.S. PATENT DOCUMENTS

2012/0205686 A1  8/2012 Seo et al.
2014/0312320 A1* 10/2014 Yang ................. H01L 29/66969
                                                        257/40

FOREIGN PATENT DOCUMENTS

JP      2012-182126 A    9/2012
JP      2013-127632 A    6/2013

* cited by examiner

LIGHT EMITTING DISPLAY DEVICE AND MANUFACTURING METHOD OF THE LIGHT EMITTING DISPLAY DEVICE

CROSS REFERENCE TO RELATED APPLICATIONS

This application is based upon and claims the benefit of priority from the prior Japanese Patent Application No. 2013-245394, filed on Nov. 27, 2013, the entire contents of which are incorporated herein by reference.

FIELD

The present invention is related to a light-emitting display device and a method of manufacturing the light-emitting display device.

BACKGROUND

In recent years, the demand for low power consumption has become stronger for mobile light-emitting display devices. A display which uses a Liquid Crystal Display Device, LCD, or self-light emitting device such as an organic EL display or electronic paper and the like are adopted as a display device for mobile purposes.

Among these, an organic EL display in particular does not require a back light and furthermore, since the drive voltage of a light emitting device is low, organic EL displays are attracting attention as a low power consumption and light emitting flat panel display device.

In addition, these light emitting display devices for mobile use are often attached with touch panels such as smartphones, tablets or PC's. In display devices attached with touch panels, by arranging a common electrode above a pixel region, a structure in which noise is shielded from the touch panel from a horizontal scanning signal and perpendicular scanning signal is usual.

However, in the above mentioned structure, since parasitic capacitance which occurs between a drive circuit arranged in a periphery region and a common electrode increases, there is a tendency for power consumption to increase with higher resolution and higher drive speeds. As a method for solving this problem, for example, a technology is proposed in Japanese Laid Open Patent 2003-288987 in which parasitic capacitance is reduced by reducing the film thickness of an interlayer insulation film above a lower layer wiring and reducing the thickness of an interlayer insulation film at an intersection point between a lower layer wiring and upper layer wiring.

As described above, it is necessary to reduce parasitic capacitance as much as possible in order to provide a light emitting display device with low power consumption. However, as in patent document 1 for example, in a technology which only reduces the thickness of an interlayer insulation film above a lower layer wiring, an interlayer insulation film pattern corresponding one to one to a lower layer wiring pattern becomes necessary. That is, because it is necessary to form an interlayer insulation film pattern which matches a lower layer wiring, the level of freedom in circuit design is remarkably reduced.

SUMMARY

A light emitting display device related to one embodiment of the present invention includes an insulation film arranged above a first substrate, a first wiring arranged above the insulation film in a pixel region, a second wiring arranged above the insulation film in a periphery region of a periphery of the pixel region, a common electrode continuously arranged to the pixel region and the periphery region, a first insulation layer arranged between the first wiring and the common electrode, and a second insulation layer arranged between the second wiring and the common electrode and having a larger thickness than the first insulation layer.

In addition, in another preferred aspect of the present invention, the common electrode may be arranged to overlap a drive circuit arranged in the periphery region.

In addition, in another preferred aspect of the present invention, the first insulation layer may include a first insulation film and a second insulation film arranged above the first insulation film, and the second insulation layer may include a third insulation film and a fourth insulation film arranged above the third insulation film, wherein the fourth insulation film may be thicker than the second insulation film.

In addition, in another preferred aspect of the present invention, the second insulation film may be formed by the same process as the fourth insulation film.

In addition, in another preferred aspect of the present invention, at least a part of the second insulation film and the fourth insulation film may be formed by a different process.

In addition, in another preferred aspect of the present invention, at least a part of the fourth insulation film may be formed by an inkjet method.

In addition, in another preferred aspect of the present invention, the fourth insulation film may be a stacked structure of an organic film and an inorganic film.

In addition, another preferred aspect of the present invention may further include a second substrate facing the first substrate, and a color filter arranged between the pixel and the second substrate.

In addition, another preferred aspect of the present invention may further include a film having translucency between the second substrate and the color filter in the pixel region, wherein the color filter may be arranged closer to the first substrate than a position where at least a convex part including the fourth film contacts the second substrate in the periphery region.

In addition, in another preferred aspect of the present invention, the convex part may be fixed to the second substrate via an adhesive.

In addition, another preferred aspect of the present invention may further include a filler material present in a space closed by the first substrate, the second substrate and the convex part.

A manufacturing method of a light emitting display device related to one embodiment of the present invention includes forming an insulation film above a substrate, forming a first wiring above the insulation film in a pixel region, forming a second wiring above the insulation film in a periphery region of a periphery of the pixel region, forming a first insulation layer above the first wiring, forming a second insulation layer thicker than the first insulation layer above the second wiring, and forming a common continuously electrode to the pixel region and the periphery region above the first insulation layer and the second insulation layer.

In addition, in another preferred aspect of the present invention, the first insulation layer may include a first insulation film and a second insulation film, the first insulation film may be formed above the first wiring, and the second insulation film may be formed above the first insulation film, wherein the second insulation layer may include a third insulation film and a fourth insulation film thicker than the second insulation film, the third insulation film may be formed above the second insulation film, and the fourth insulation film may be formed above the third insulation film, wherein the second insulation film and the fourth insulation film may be formed by the same process by exposure using a multi-gradation mask.

In addition, in another preferred aspect of the present invention, the first insulation layer may include a first insulation film and a second insulation film, the first insulation film may be formed above the first wiring, and the second insulation film may be formed above the first insulation film, wherein the second insulation layer may include a third insulation film and a fourth insulation film thicker than the second insulation film, the third insulation film may be formed above the second insulation film, and the fourth insulation film may be formed above the third insulation film, wherein at least a part of the second insulation film and the fourth insulation film may be formed by exposure a plurality of times using a different process.

In addition, in another preferred aspect of the present invention, the first insulation layer may include a first insulation film and a second insulation film, the first insulation film may be formed above the first wiring, and the second insulation film may be formed above the first insulation film, wherein the second insulation layer may include a third insulation film and a fourth insulation film thicker than the second insulation film, the third insulation film may be formed above the second insulation film, and the fourth insulation film may be formed above the third insulation film, wherein the fourth insulation film may be formed by an inkjet method.

DESCRIPTION OF EMBODIMENTS

The light emitting display device and manufacturing method of the light emitting display device related to the present invention are explained below while referring to the diagrams. However, the light emitting display device and manufacturing method of the light emitting display device related to the present invention can be realized by many different forms and should not be interpreted as being limited to the contents described in the embodiments shown below. Furthermore, in the diagrams referred to in the embodiments, the same parts or parts having similar functions are attached with the same reference symbols and repeated explanations are omitted.

(Embodiment One)

Figure 1:
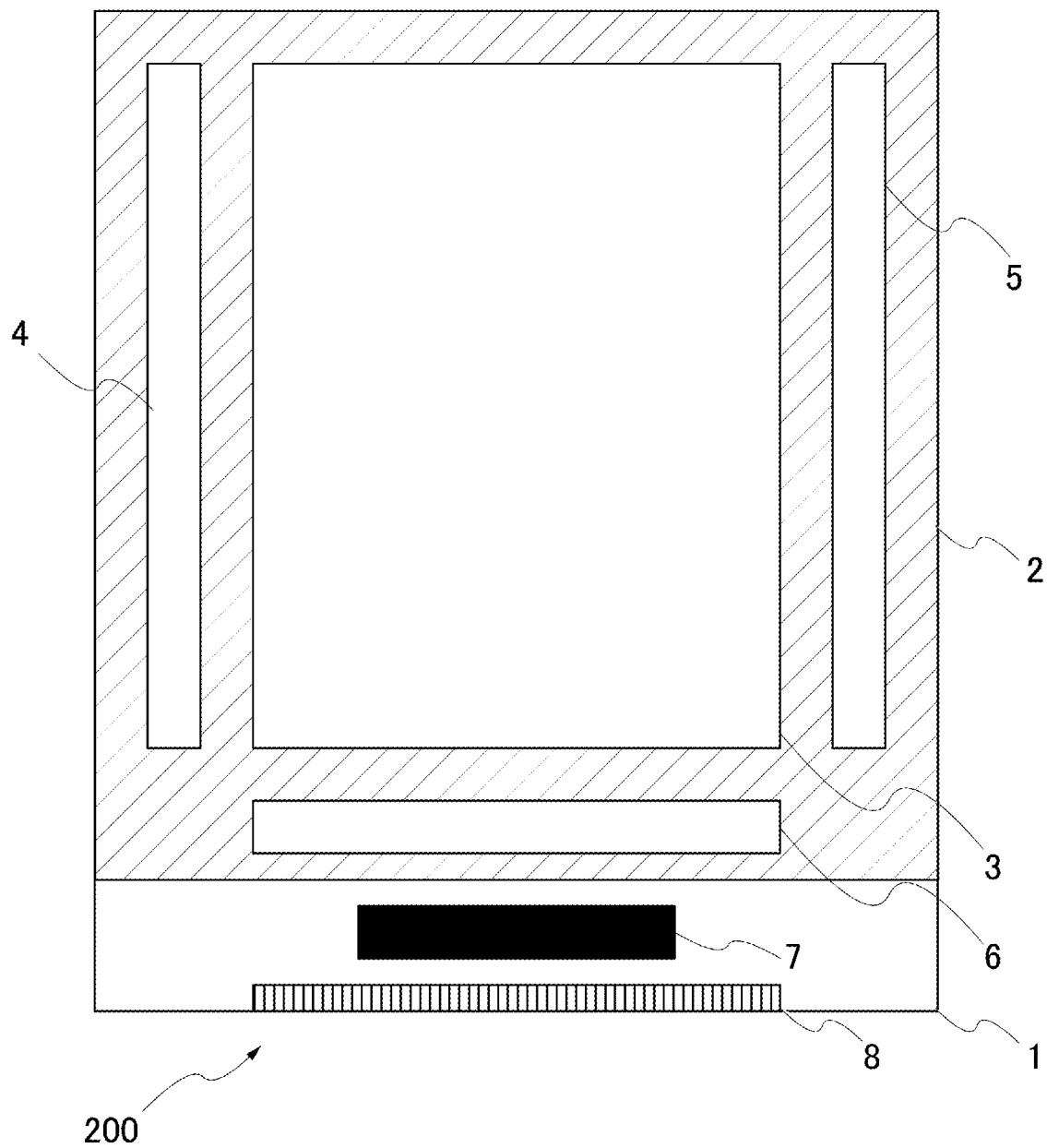
FIG. 1 is a schematic diagram showing an example of the structure of an electronic device related to embodiment one of the present invention.
Figure 2:
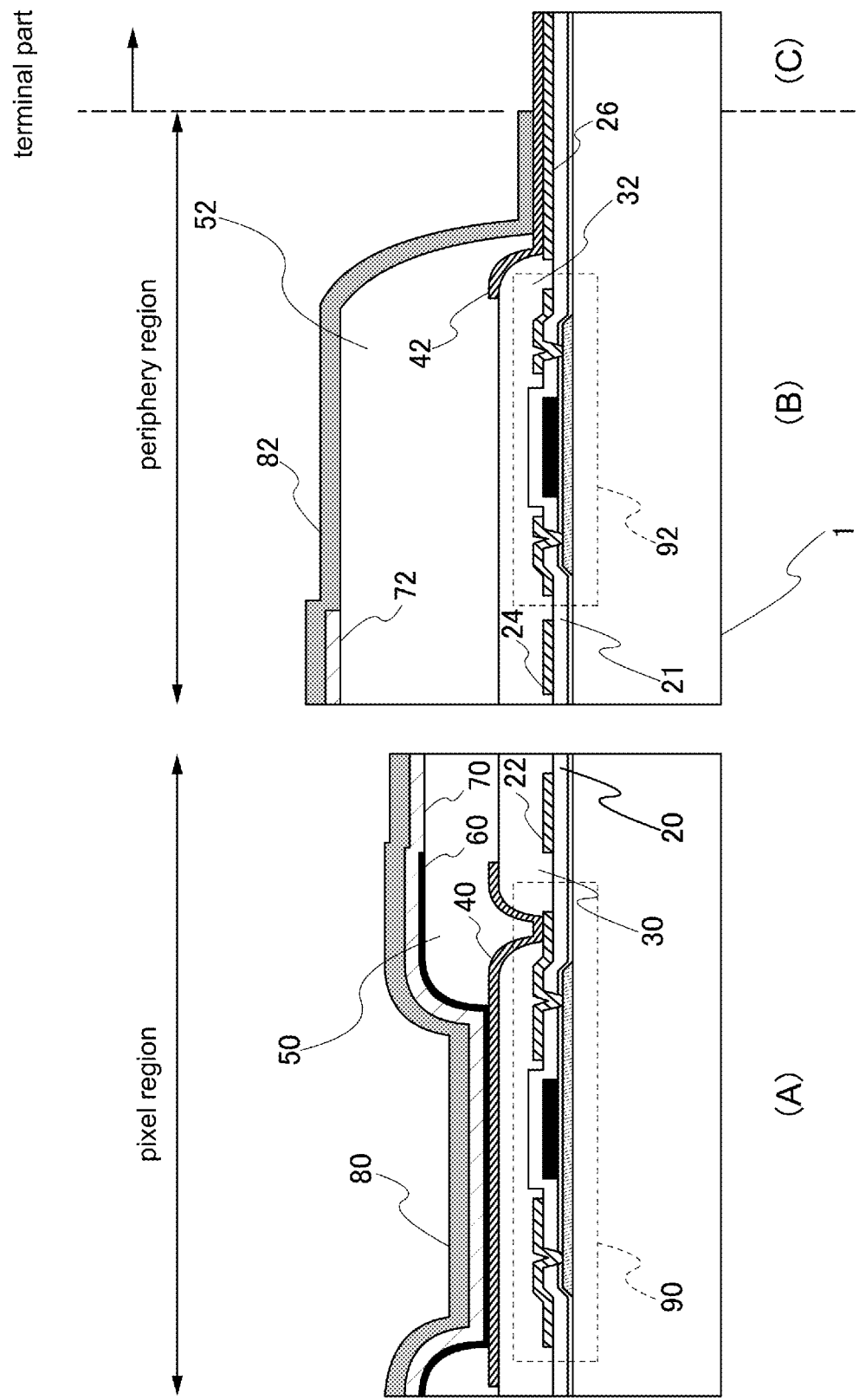
FIG. 2 is a cross-sectional schematic diagram of a transistor array substrate in embodiment one of the present invention.

The structure of the light emitting display device related to embodiment one of the present invention is explained using FIG. 1 and FIG. 2. The light emitting display device 200 includes a first substrate 1 formed with a transistor and wiring, and a second substrate 2 formed with a color filter etc. The first substrate 1 includes a display part 3 which displays an image, drive circuits 4, 5, 6 which drive pixels of the display part 3, an LSI chip 7 mounted on a glass substrate for controlling the drive circuits, and an FPC terminal part 8 for connecting to an external terminal such as an FPC (Flexible Printed Circuit). Here, the display part 3 is called a pixel region, and a region in which a drive circuit in a periphery of the pixel region is arranged is called a periphery region.

FIG. 2 shows a cross-sectional schematic diagram of a pixel region and periphery region of the first substrate 1 in FIG. 1. The cross-section shown in FIG. 2 (A) corresponds to the wiring part and transistor part of the pixel region 3, and the cross-section shown in FIG. 2 (B) corresponds to the wiring part and transistor part in the periphery region in the periphery of the pixel region. In addition, the cross-section shown in FIG. 2 (C) corresponds to a terminal part including the LSI chip 7 and FPC terminal part 8

A first wiring 22 and transistor 90 of a pixel circuit are arranged in the pixel region in FIG. 2, and above these, a first insulation film 30 is arranged as an interlayer film. A pixel electrode 40 which serves as a lower part electrode of a light emitting element arranged in a pixel is arranged above the first insulation film 30, and is connected to the transistor 90 at an aperture part of the first insulation film 30. A second insulation film 50 which serves as a bank of a light emitting element is arranged above the pixel electrode 40. A light emitting layer 60 is arranged above the second insulation film 50 and above the pixel electrode 40 of a light emitting part of a pixel exposed at an aperture part of the second insulation film 50, and a common electrode 70 which serves as an upper part electrode of a light emitting element is further arranged above the light emitting layer 60. The common electrode 70 is arranged across the entire area of a pixel region and a part overlaps the first wiring 22. In a region where the first wiring 22 and the common electrode 70 overlap, the first insulation layer including the first insulation film 30 and second insulation film 50 is arranged between the first wiring 22 and common electrode 70.

A second wiring 24 and third wiring 26 on the same layer as the first wiring 22, and a periphery circuit transistor 92 are arranged in the periphery region and terminal part in FIG. 2, and above these, a third insulation film 32 on the same layer as the first insulation film 30 is arranged as an interlayer film. An external terminal electrode 42 on the same layer as the pixel electrode 40 is arranged on one part above the third insulation film 32, and a fourth insulation film 52 which is thicker than the second insulation film 50 on the same layer the second insulation film 50 is arranged above the third insulation film 32 and above one part of the external terminal electrode 42. A common electrode 72 on the same layer as the common electrode 70 is arranged above the fourth insulation film 52 so as to not overlap the transistor 92. In a region where the second wiring 24 and the common electrode 72 overlap, a second insulation layer including the third insulation film 32 and fourth insulation film 52 is arranged between the second wiring 24 and common electrode 72. Here, the second insulation layer is thicker compared to the first insulation layer. In addition, the first wiring 22 and second wiring 24 are formed above the insulation films 20, 21 formed on the same layer.

By making the thickness of the second insulation layer thicker than the first insulation layer, the effects of parasitic capacitance between the wiring 24 and the common electrode 72 in the periphery region can be made smaller than the parasitic capacitance between the second wiring 22 and common electrode 70 in the pixel region. As a result, it is possible to obtain effects such as a reduction in power consumption and high speed circuit driving when driving a circuit. In addition, because only the second insulation layer is formed thicker in the periphery region in this way, it is not necessary to change the structure of an insulation layer in the pixel region. That is, it is possible to reduce the effects of parasitic capacitance in a periphery region without affecting a display region.

In the structure in embodiment one, because the common electrode 72 in the periphery region and the transistor 92 of the periphery circuit are arranged so as not overlap, it is possible to reduce parasitic capacitance between the common electrode 72 and transistor 92. However, in the structure of the present invention, by forming the second insulation layer in the periphery region thicker than the first insulation layer in the pixel region, it is possible to separate the distance between the transistor 92 in the periphery circuit and common electrode 72. Therefore, as is also explained in other embodiments herein, in the case where the common electrode 72 is arranged across the entire periphery region, that is, even in the case where the common electrode 72 and the transistor 92 overlap, it is possible to reduce the effects of an increase in power consumption or a drop in circuit drive speed to almost nothing. That is, because it is not necessary to pattern the common electrode 72, it is possible to reduce processing, improve yield and reduce costs.

In the present invention, because the second insulation layer in the periphery region is formed thicker than at least the first insulation layer in the pixel region, it is possible to reduce the effects of parasitic capacitance between the wiring 24 in the periphery region and the common electrode 72. As a result, it is possible to reduce power consumption and increase drive speed of a circuit when driving a circuit. When the thickness of the second insulation layer is 1.2 times or more the thickness of the first insulation layer, preferably 1.5 times or more and more preferably twice the thickness or more, these effects are further demonstrated.

It is possible to use an organic resin material as the material of the first insulation film 30 and third insulation film 32. For example, it is possible to use an organic resin material such as acryl or imide using a method such as a dip method, spin coat method or inkjet method. By using an organic resin material for the material of the first insulation film 30 and third insulation film 32, since an organic resin material has a low dielectric constant compared to an inorganic material, it is possible to reduce parasitic capacitance between the wiring 22 and common electrode 70 and between the wiring 24 and common electrode 72. In addition, because it is possible to planarize a step formed by the transistors 90, 92 and the first wiring 22, second wiring 24 and the third wiring, it is possible to reduce defects such as broken wires of the pixel electrode 40 in a step part.

However, if the above mentioned planarization is not required, the first insulation film 30 and third insulation film 33 may be formed from an inorganic film such as silicon oxide or silicon nitride for example. By forming the first insulation film 30 and third insulation film 32 with an inorganic film, it is possible to improve mechanical strength and block a water component or impurities from reaching a transistor from the exterior and thereby it is possible to obtain a display device with better reliability.

In addition, it is preferable to use an organic resin material as the material of the second insulation film 50 and fourth insulation film 52, for example, it is possible to use an organic resin material such as acryl or imide using a method such as a dip method, spin coat method or inkjet method. By using an organic resin material for the material of the second insulation film 50 and fourth insulation film 52, since an organic resin material has a low dielectric constant compared to an inorganic material, it is possible to reduce parasitic capacitance between the wiring 22 and common electrode 70 and between the wiring 24 and common electrode 72. In addition, because it is possible to planarize a step formed by the transistors 90, 92 or the first wiring 22, second wiring 24 and the third wiring 26, or a step formed at an aperture part of the first insulation film 30 and third insulation film 32, it is possible to reduce defects such as broken wires of the pixel electrode 40 in a step part. In addition, it is possible to improve the covering properties of protective films 80, 82 formed thereupon. As a result, it is possible to obtain a display device with better reliability.

In addition, it is possible to use not only an organic film for the second insulation film 50 and the fourth insulation film 52 but also a stacked structure of both an organic film and inorganic film. By using a stacked structure of both an organic film and inorganic film, adhesion between the organic film and a common electrode is improved and furthermore, mechanical strength of the transistor 92 of a periphery circuit is improved. As a result, it is possible to obtain a display device with better reliability.

In FIG. 1, the display part 3 has pixels arranged in a matrix shape and an image is displayed by causing a light emitting element in each pixel to emit light. In embodiment one, a light emitting element in each pixel includes a light emitting diode. In this example, although a light emitting display device using an organic light emitting diode (OLED) is explained as a light emitting diode, a light emitting element including rectification (light emitting diode) may also be used in addition to an OLED.

Drive circuits 4, 5, 6 are circuits for driving a pixels arranged in a matrix shape in the display part 3, and include a gate line control circuit, an emission control circuit and a data line control circuit. The gate line control circuit is a drive circuit which selects a row for executing data writing, and performs exclusive selection in a certain order for each row. The emission control circuit is a drive circuit for controlling the timing of supply of a power voltage to a light emitting element. The data line control circuit is a drive circuit which determines gradation based on input image data and supplies a data voltage corresponding to the determined gradation to each pixel.

The LSI chip 7 is an integrated circuit including a circuit for controlling the above mentioned drive circuits and is mounted directly on a glass substrate by a mounting technology such as COG (Chip On Glass). COG is often used in light emitting display devices for mobile use and is useful in forming thin films in light emitting display devices. The FPC terminal part 8 connects the first substrate 1 and the FPC by FOG (Film On Glass). By using FPC it is possible to freely arrange a circuit substrate even in the case where space is limited. For example, by arranging a LSI chip connected using FPC to the rear side of the first substrate it is possible to reduce the frame area of a light emitting display device.

As is shown in FIG. 2, the external terminal electrode 42 is arranged extending to a terminal part above the third wiring 26 in a periphery region and terminal part. A structure in which a low resistance material such as Al (aluminum), or Ti (titanium) or Mo (molybdenum) arranged above Al is often used for the third wiring 26. However, since Al oxidizes very easily, it is easy to provide the surface with insulation. In addition, although not to the extent of Al, Ti and Mo also have a low resistance value near the surface which rises easily by oxidation. Providing insulation to an Al surface or high resistance to a Ti or Mo surface causes problems such as increasing resistance between FPC in the LSI chip 7 or FPC terminal part 8 and a wire formed in the first substrate 1. As described above, by forming a film which is difficult to oxidize compared to Al, Ti or Mo above Al, Ti or Mo, it is possible to reduce resistance between the LSI chip 7 or FPC in the FPC terminal part 8 and wiring formed in the first substrate 1.

In addition, protective films 80 and 82 may be arranged in a region except a terminal part above the common electrodes 70 and 72. The protective films 80 and 82 control water from permeating the light emitting layer 60 or transistors 90 and 92 and control degradation in characteristics. It is preferred that an insulation material such as silicon nitride, silicon oxide, aluminum nitride or aluminum oxide be used as the material for the protective films. The protective film is removed at the position of the LSI chip 7 or the FPC terminal part 8 to secure conductivity with external terminals.

Figure 3:
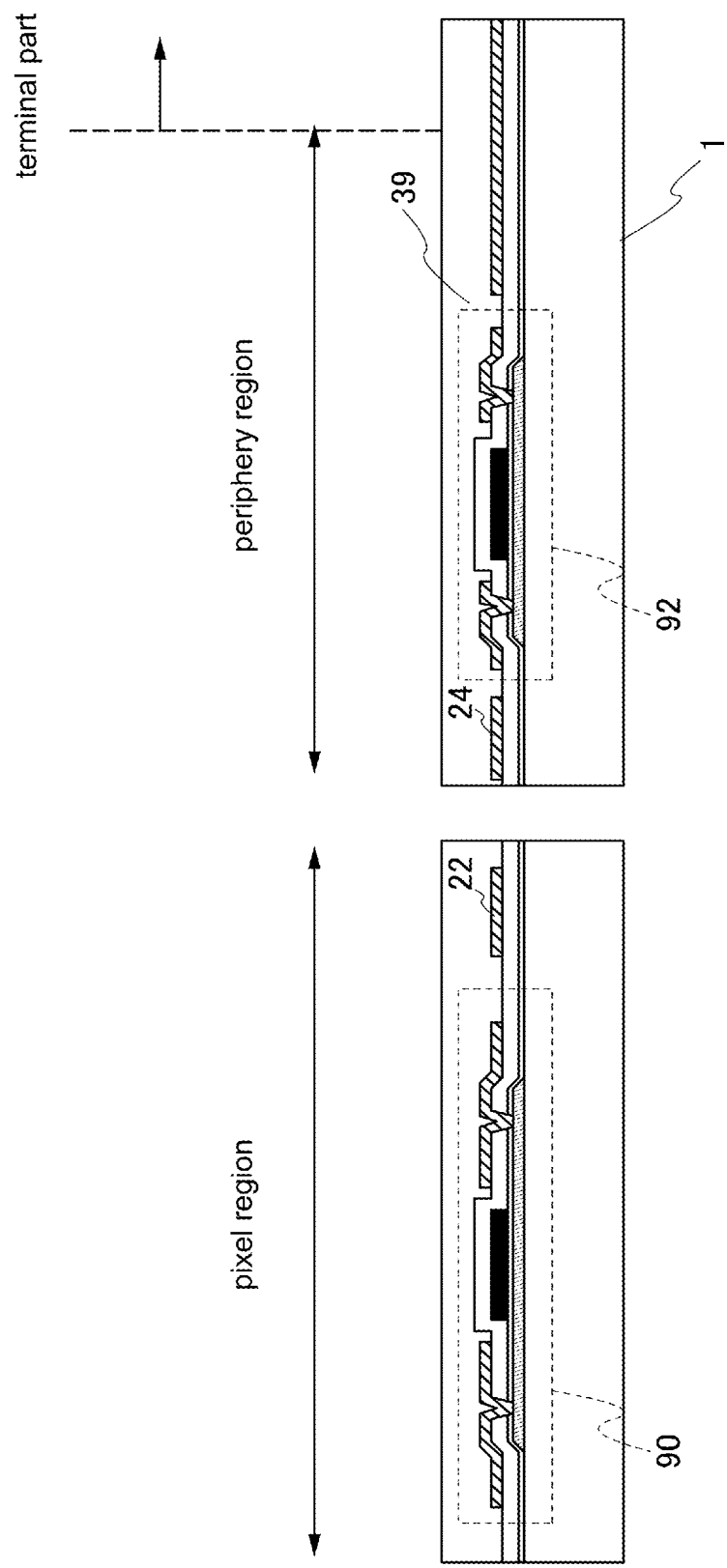
FIG. 3 is a cross-sectional process diagram of a transistor array substrate in embodiment one of the present invention.

Next, a manufacturing method of the light emitting display device related to embodiment one is explained using cross-sectional views in FIG. 3 to FIG. 13. FIG. 3 shows the state whereby the transistors 90, 92 and wirings 22 and 24 are planarized by an insulation film 39 which is formed thereupon and later becomes the first insulation film 30 and third insulation film 32. Here, a transistor may be manufactured using a general means and a detailed explanation is emitted. In addition, in embodiment one, an example whereby a photosensitive resin film is formed using a spin coat method as the interlayer film 39 is explained.

Figure 4:
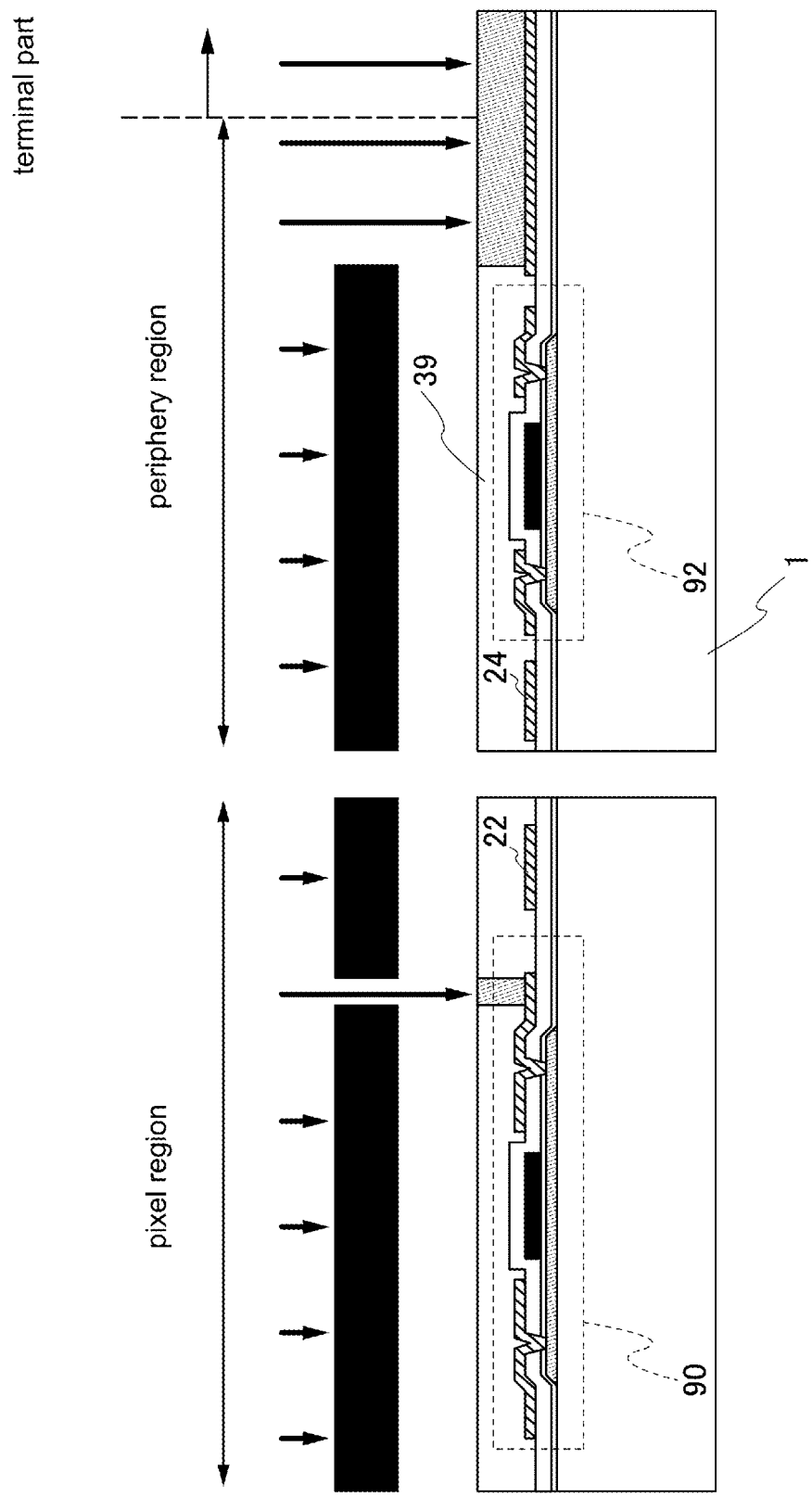
FIG. 4 is a cross-sectional process diagram of a transistor array substrate in embodiment one of the present invention.
Figure 5:
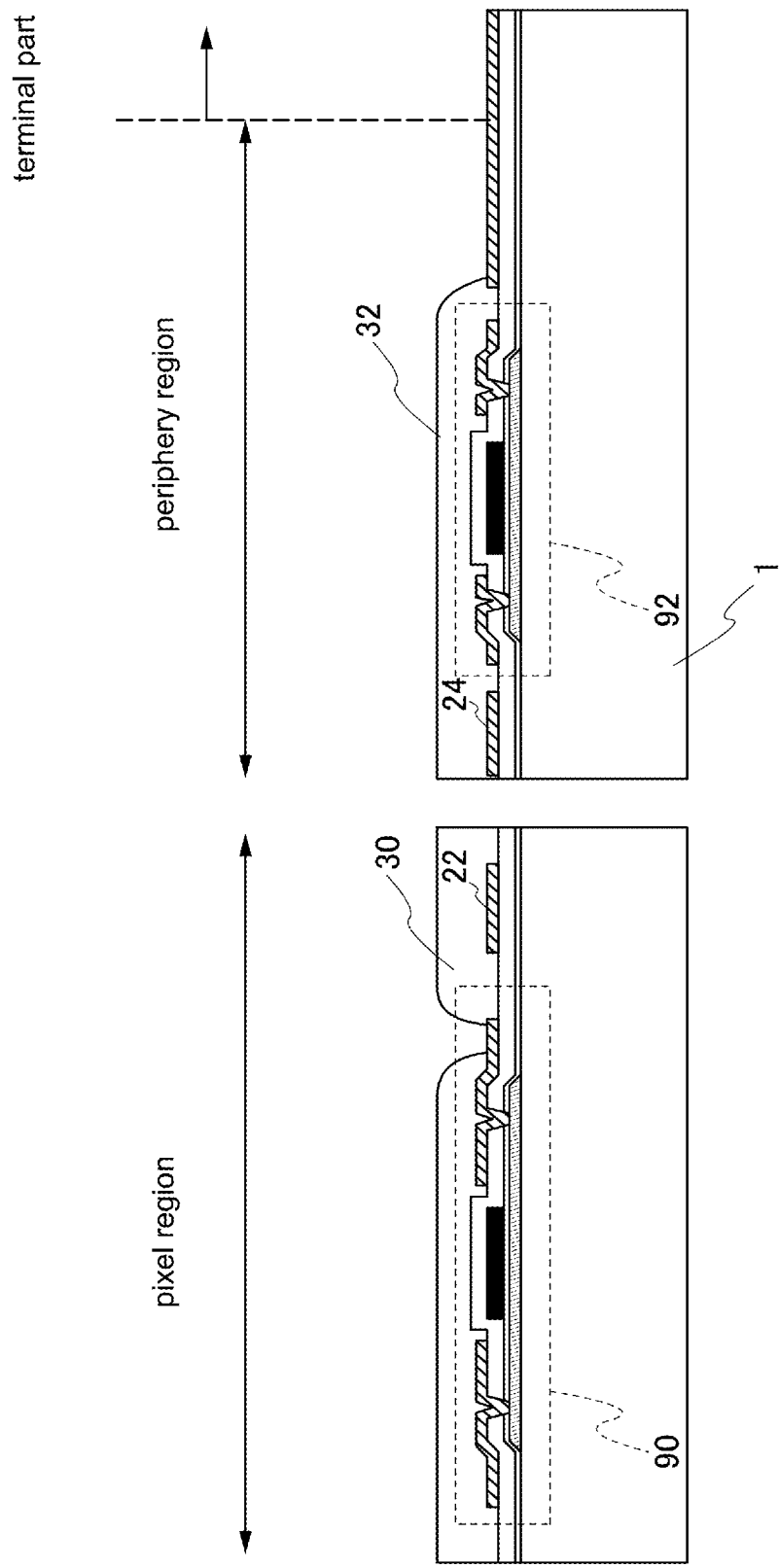
FIG. 5 is a cross-sectional process diagram of a transistor array substrate in embodiment one of the present invention.

In FIG. 4, a photosensitive resin film is exposed using a usual photomask. Here, a positive type photosensitive resin is used. Parts exposed by a development process are dissolved and unexposed parts which are not dissolved remain. Regions where apertures are to be formed using a photomask are exposed and the photosensitive resin is removed by a development process. Here, in order to make it difficult for wiring to break, it is preferred that the exposure time and development conditions are adjusted in order to provide the ends of the aperture parts with a slanted surface (taper shape). Using the above described process, it is possible to obtain an aperture part having the taper shape shown in FIG. 5.

Figure 6:
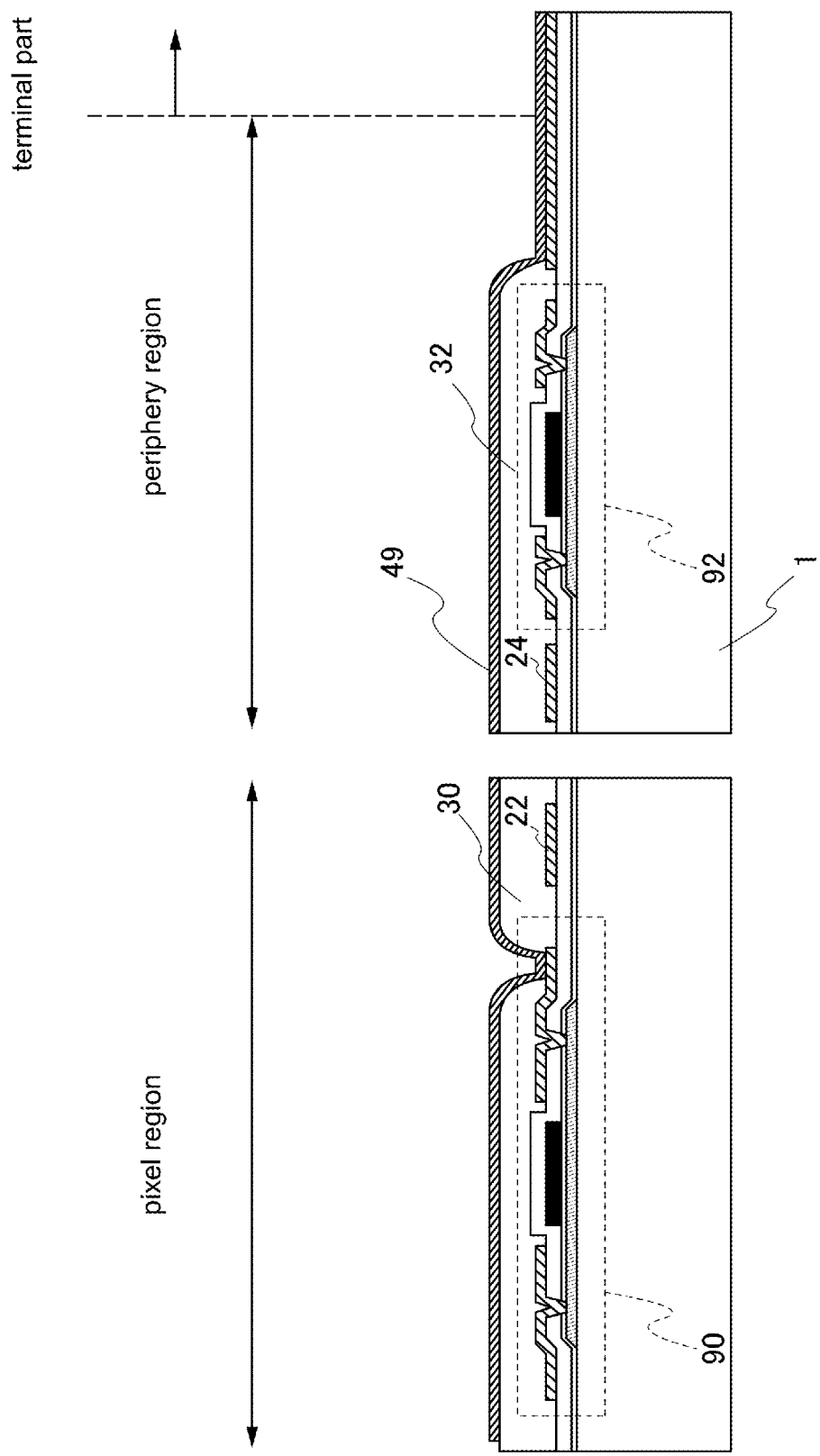
FIG. 6 is a cross-sectional process diagram of a transistor array substrate in embodiment one of the present invention.

In FIG. 6, a pixel electrode layer 49 is formed on the entire surface of the first insulation film 30 and third insulation film 32. Here, it is preferred that a transparent conductive film with a high translucency such as ITO (Indium Tin Oxide), ZnO (Zinc Oxide), IZO (Indium Zinc Tin and Zinc Oxide composite material) is formed in the case of a bottom emission type organic EL display as the material of a pixel electrode. On the other hand, in the case of a top emission type organic EL display, it is preferred that a metal film with high reflectivity is formed such as Al alloy or Ag alloy.

Figure 7:
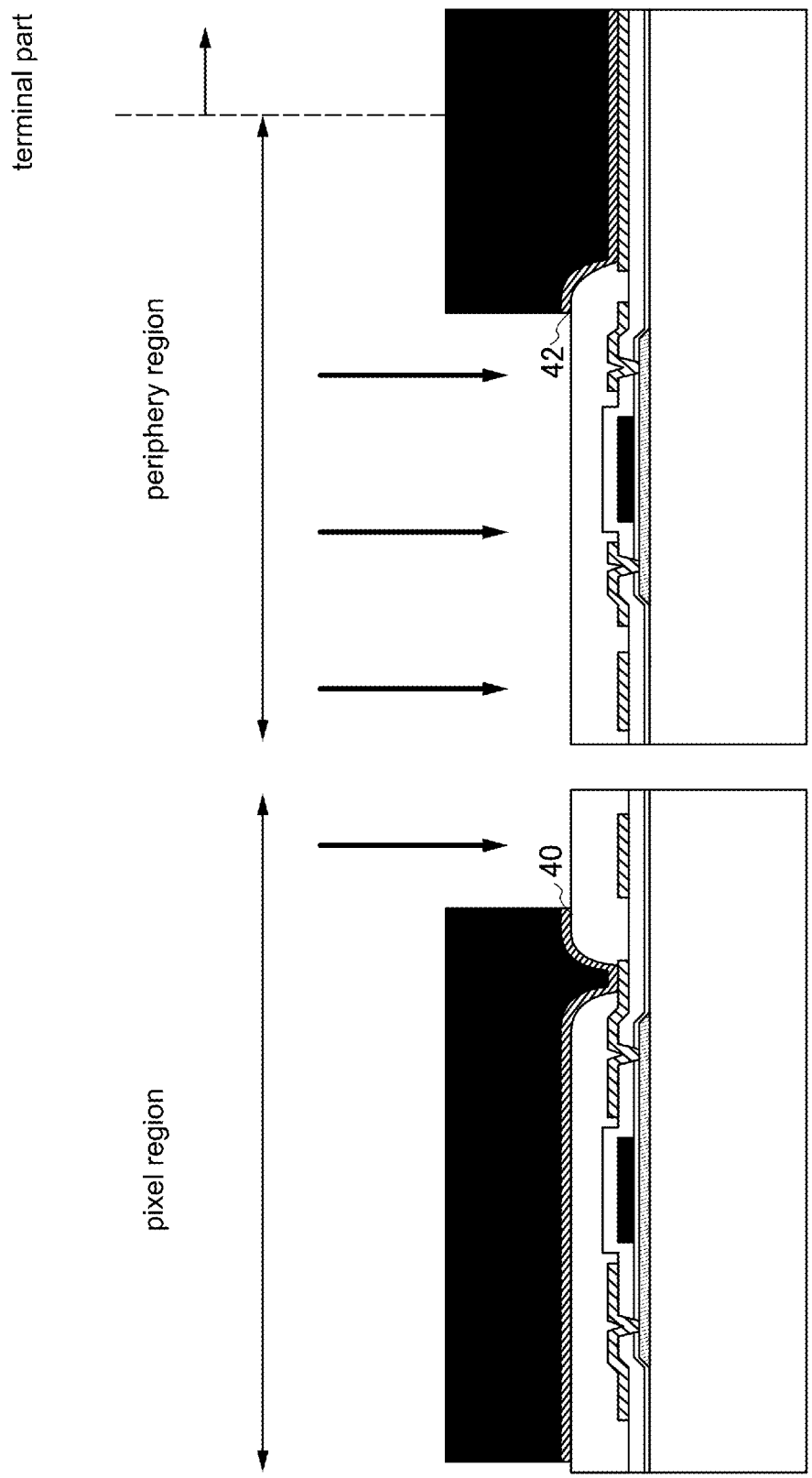
FIG. 7 is a cross-sectional process diagram of a transistor array substrate in embodiment one of the present invention.

In FIG. 7, parts of the pixel electrode layer 49 to remain are covered using a resist and other parts are etched and removed. The etching method can be appropriately selected according to the material used for the pixel electrode. For example, it is possible to use wet etching using an etchant with an oxalic acid base for ITO (Indium Tin Oxide). In addition, it is possible to use wet etching using an etchant with a phosphoric acid or acetic acid base for an Al alloy. In addition, it is possible to use dry etching using a chlorinated gas or fluorinated gas for Ti or W. In either of these etching methods, it is preferred that processing be performed using an etching method with a large selection ration between the first insulation film 30 and third insulation film 32 formed below the pixel electrode layer 49. A pixel electrode 40 and external terminal electrode 42 are formed from the pixel electrode layer 49 using the etching method described above.

Figure 8:
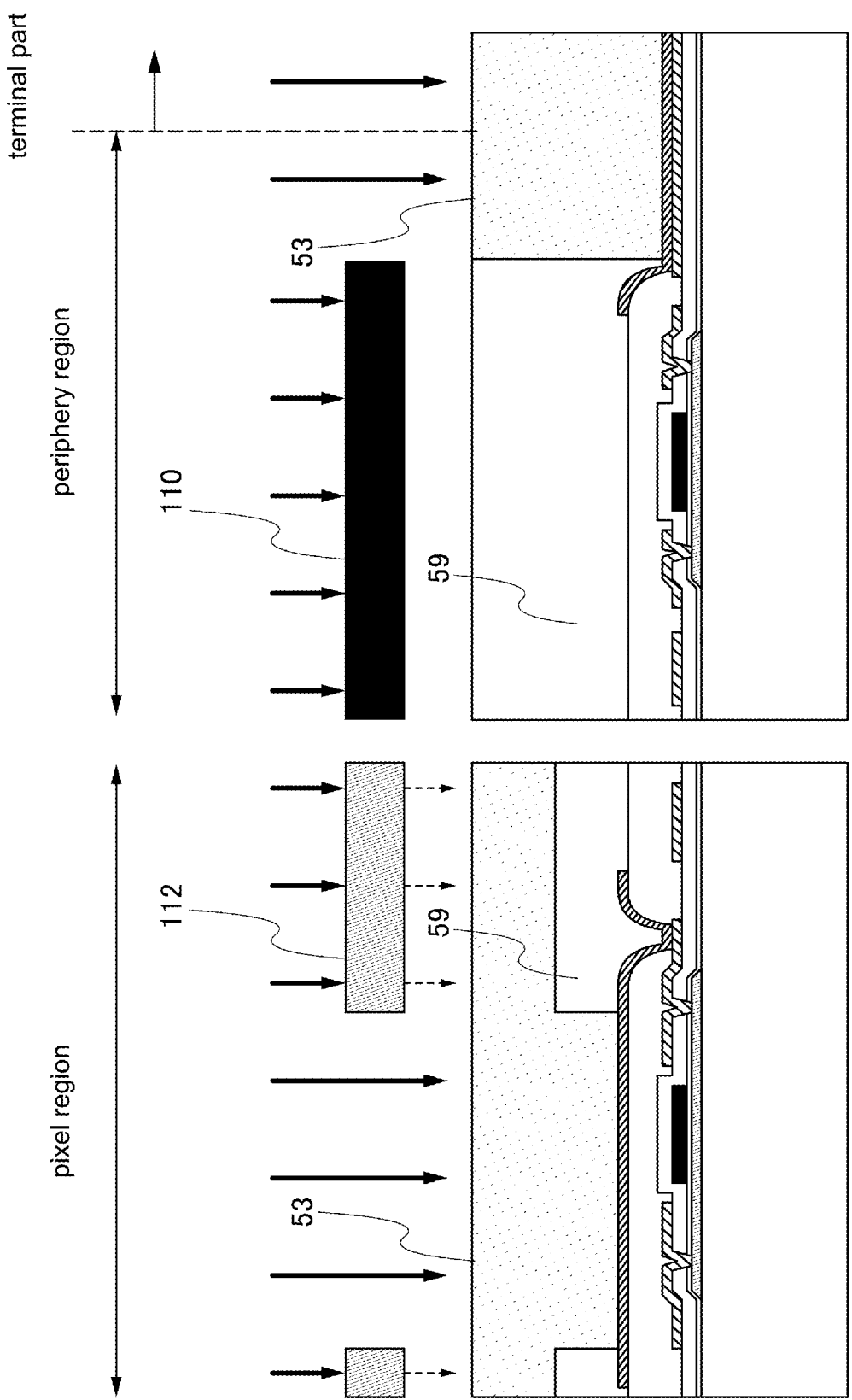
FIG. 8 is a cross-sectional process diagram of a transistor array substrate in embodiment one of the present invention.

In FIG. 8, an insulation film 59 which later becomes the second insulation film 50 and fourth insulation film 52 is formed above the pixel electrode 40 and external terminal electrode 42. In addition, in embodiment one, an example in which the insulation film 59 is formed by spin coating a photosensitive resin is explained.

In embodiment one, a method for forming the second insulation film 50 and fourth insulation film 52 from the insulation film 59 with a different film thickness using the same process is explained. In embodiment one, a method of exposing a photosensitive resin formed as the insulation film 59 using a multi-gradation mask is explained as an example of a method for forming the second insulation film 50 and fourth insulation film 52 with different film thicknesses.

It is known that there are two types of multi-gradation masks, a grey tone mask and half tone mask. A grey tone mask includes a slit with a resolution lower than an exposure apparatus and an intermediate exposure is realized when the slit part blocks a part of light. However, a half tone mask performs intermediate exposure uses a semi-translucent film. In either case, it is possible to express three exposure levels [exposed part], [intermediate exposed part] and [non-exposed part] using one exposure and it is possible to create a photosensitive resin with two types of thickness or more after development.

An exposure process using a half tone mask is shown in FIG. 8. A half tone mask arrange on the upper part of the first substrate is configured by a light shielding film 110 and a semi-translucent film 112. The light shielding film 110 completely shields the patterning light of an exposure device and the semi-translucent film 112 weakens the intensity of the patterning light of the exposure device and allows the light to pass through.

As is shown in FIG. 8, the insulation film 59 in the region corresponding to the aperture part of the half tone mask is completely photosensitized in a depth direction. However, the insulation film 59 in the region corresponding to the semi-translucent film 112 of the half tone mask is only photosensitized up to a certain depth from the surface since the intensity of the light is weak. The depth of photosensitization of the insulation film 59 in a region corresponding to the semi-translucent film is controlled by the translucency of the half tone mask and exposure conditions.

As described above, by forming the second insulation film 50 and fourth insulation film 52 with different film thicknesses using the same process, it is possible to avoid problems such as a drop in yield that accompanies an increase in the number of processes and an increase in costs.

In embodiment one, although a method for forming insulation films with different film thicknesses using the same process was explained, as is also explained in other embodiments herein, it is possible to form the second insulation film 50 and fourth insulation film 52 with different film thicknesses with a process in which at least one part is different.

Figure 9:
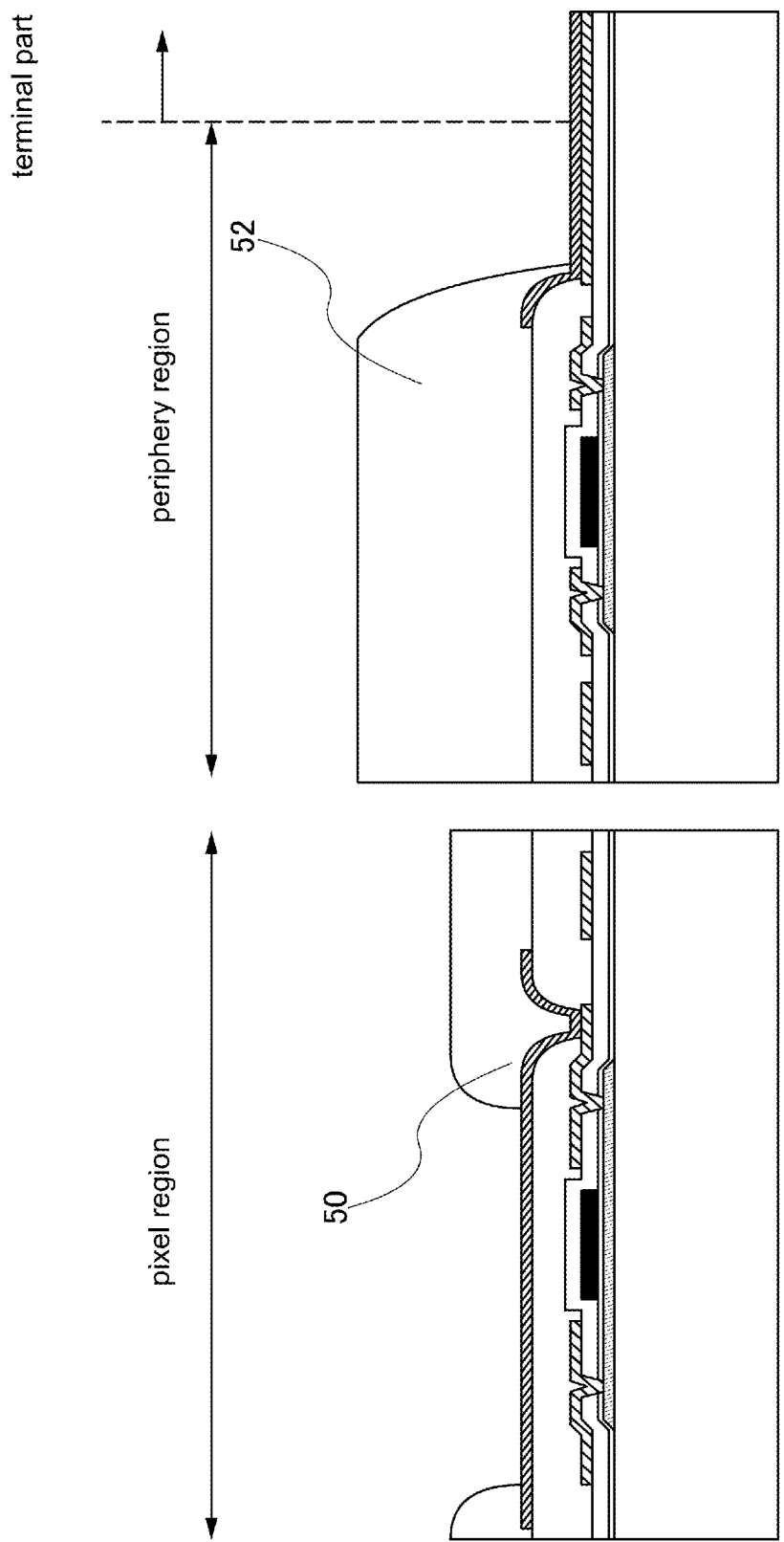
FIG. 9 is a cross-sectional process diagram of a transistor array substrate in embodiment one of the present invention.

The photosensitive resin is removed by development processing the first substrate exposed in the process shown in FIG. 8 and the second insulation film 50 and fourth insulation film 52 are formed with different thicknesses as shown in FIG. 9. Here, in order to make it difficult for the wiring to break, it is preferable to adjust the exposure time and development conditions so that the ends of the aperture part include a slanted surface (taper shape).

Figure 10:
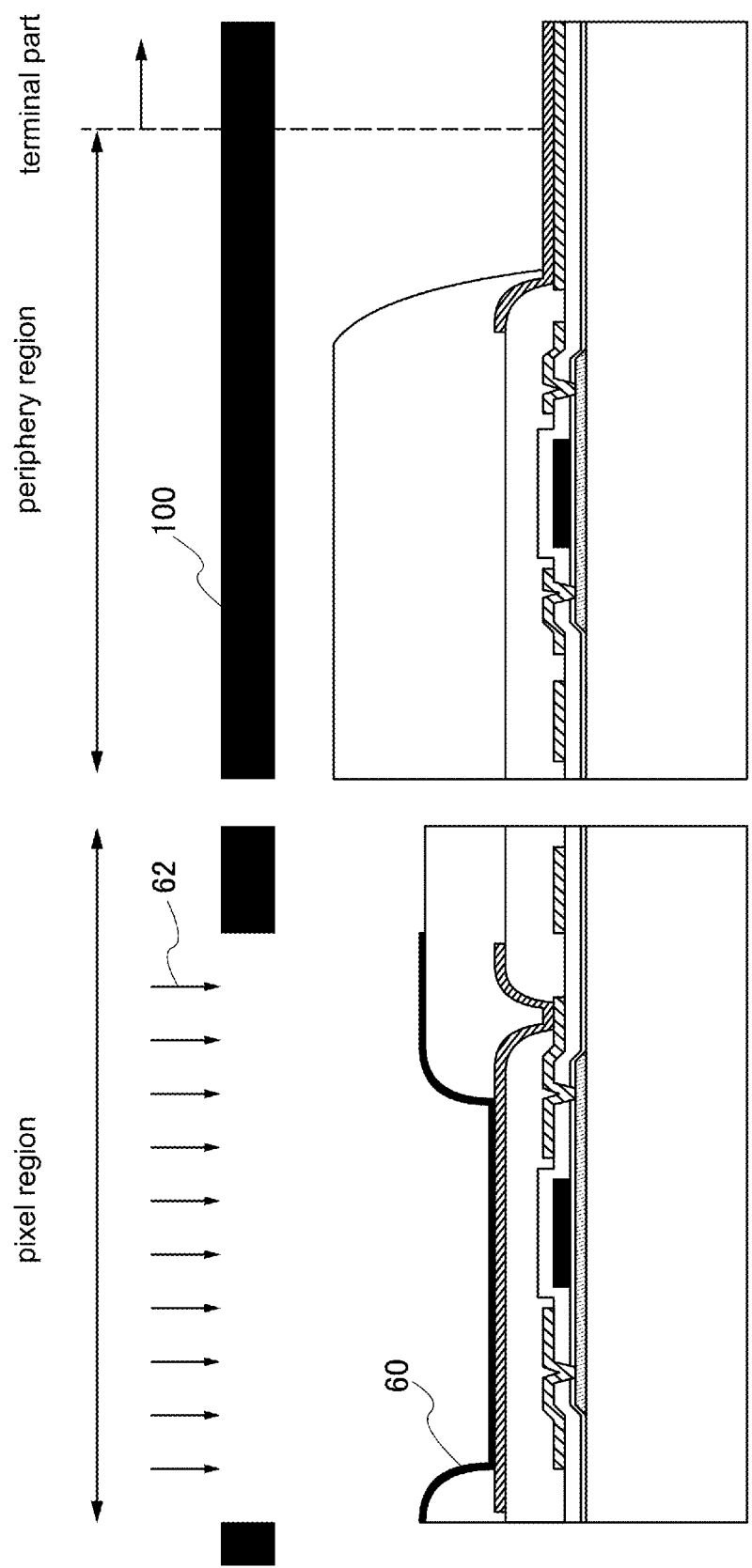
FIG. 10 is a cross-sectional process diagram of a transistor array substrate in embodiment one of the present invention.

In FIG. 10, a light emitting layer 60 is formed above a pixel electrode in a pixel region. In embodiment one, a method for forming the light emitting layer 60 by an evaporation method using a low molecular organic material is explained. As is shown in FIG. 10, the light emitting layer 60 is formed in at least a region corresponding to an aperture part of the second insulation film 50 in the pixel region by arranging a metal mask on an upper part of the first substrate and evaporating an organic material. Here, a hole transport layer and electron transport layer etc may be included so as to sandwich the light emitting layer. In addition, in embodiment one, light emitting layers which emit light in each color of red (R), green (G) and blue (B) may be stacked so that the light emitting layer emits white light, and a light emitting layer which emits blue (B) and yellow (Y) may also be stacked.

Figure 11:
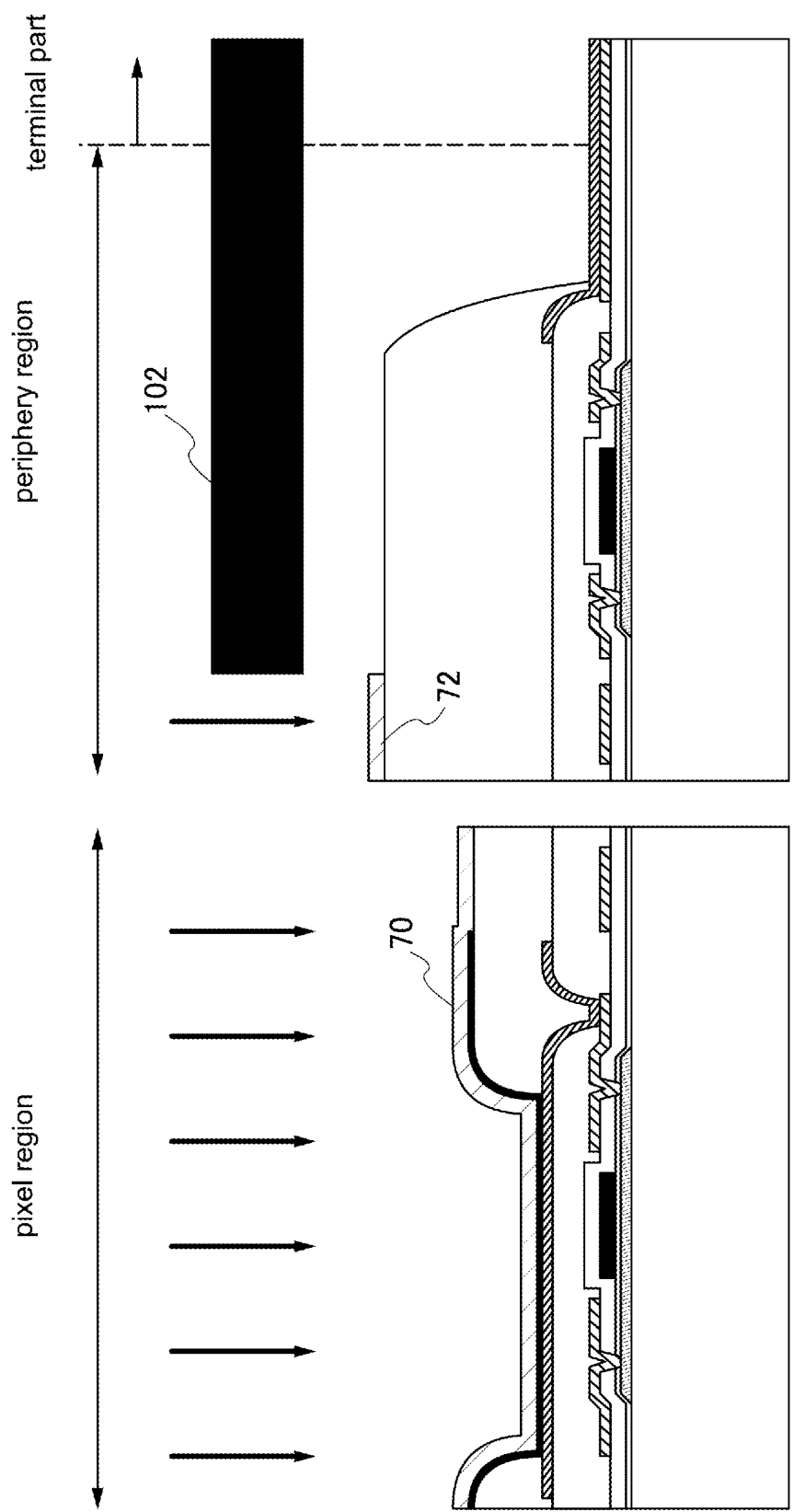
FIG. 11 is a cross-sectional process diagram of a transistor array substrate in embodiment one of the present invention.

In FIG. 11, common electrodes 70 and 72 are formed above a light emitting layer. In embodiment one, a metal mask 102 which masks the transistor 92 of a periphery circuit is arranged and a common electrode material is formed using an evaporation method or sputtering method in order to substantially reduce parasitic capacitance which is generated by overlapping the common electrode 72 and the transistor 92 of a periphery circuit.

Figure 12:
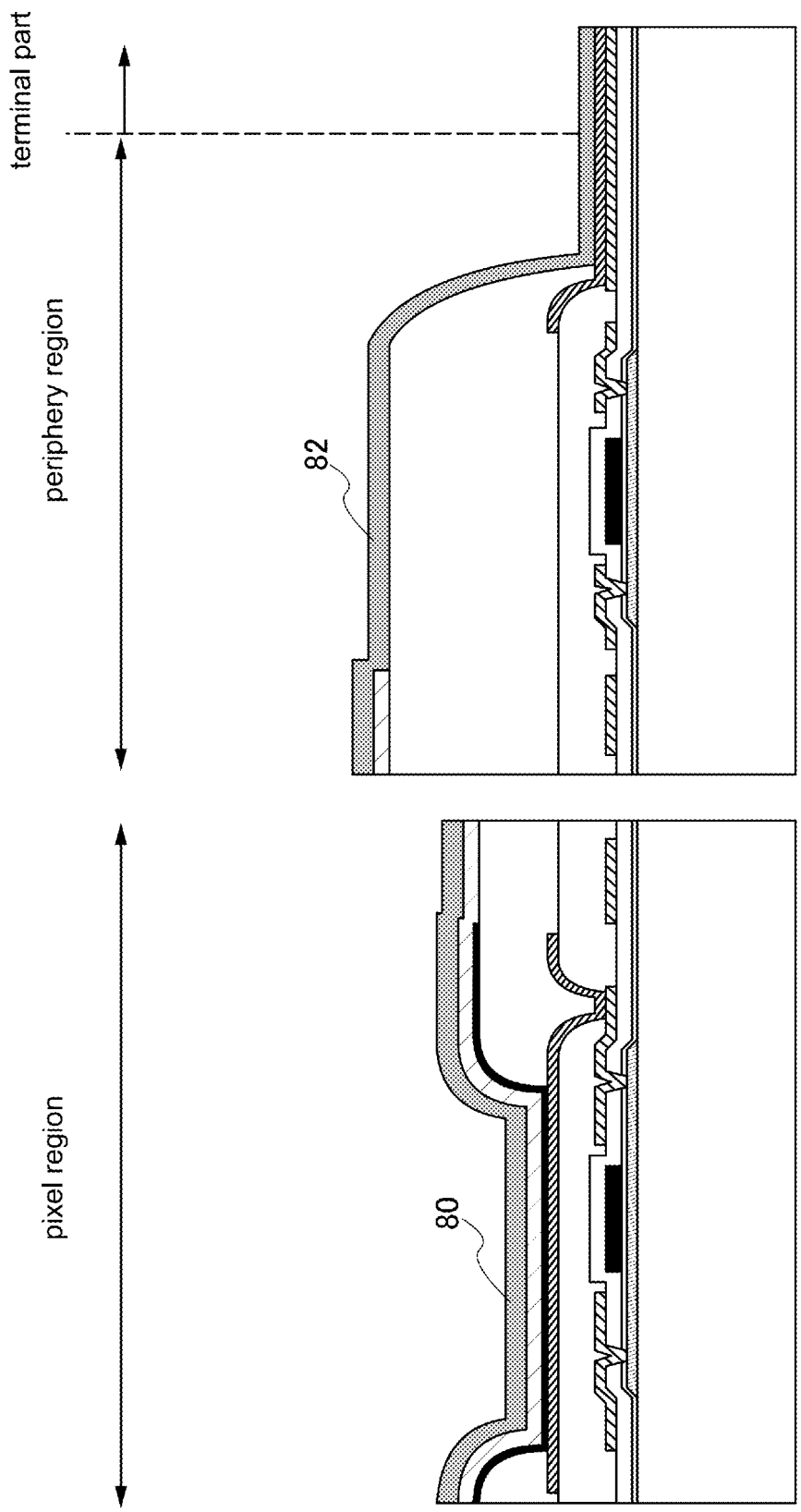
FIG. 12 is a cross-sectional process diagram of a transistor array substrate in embodiment one of the present invention.

In FIG. 12, protective films 80 and 82 are formed above a common electrode. The protective films are formed on the entire upper surface of the first substrate without using a metal mask. It is possible to use an insulation material such as silicon nitride, silicon oxide, aluminum nitride or aluminum oxide as the material of the protective film. Because the protective film is intended to protect a light emitting layer from a water component, it is preferred that they are formed so that there are no parts which are not covered. At this time, it is possible to form a protective film with good coverage by forming an aperture part of the first to fourth insulation films in a taper shape. In addition, in the case where the aperture part of the first to fourth insulation films do not have a taper shape, it is preferred that the protective film is formed with conditions having good coverage.

Figure 13:
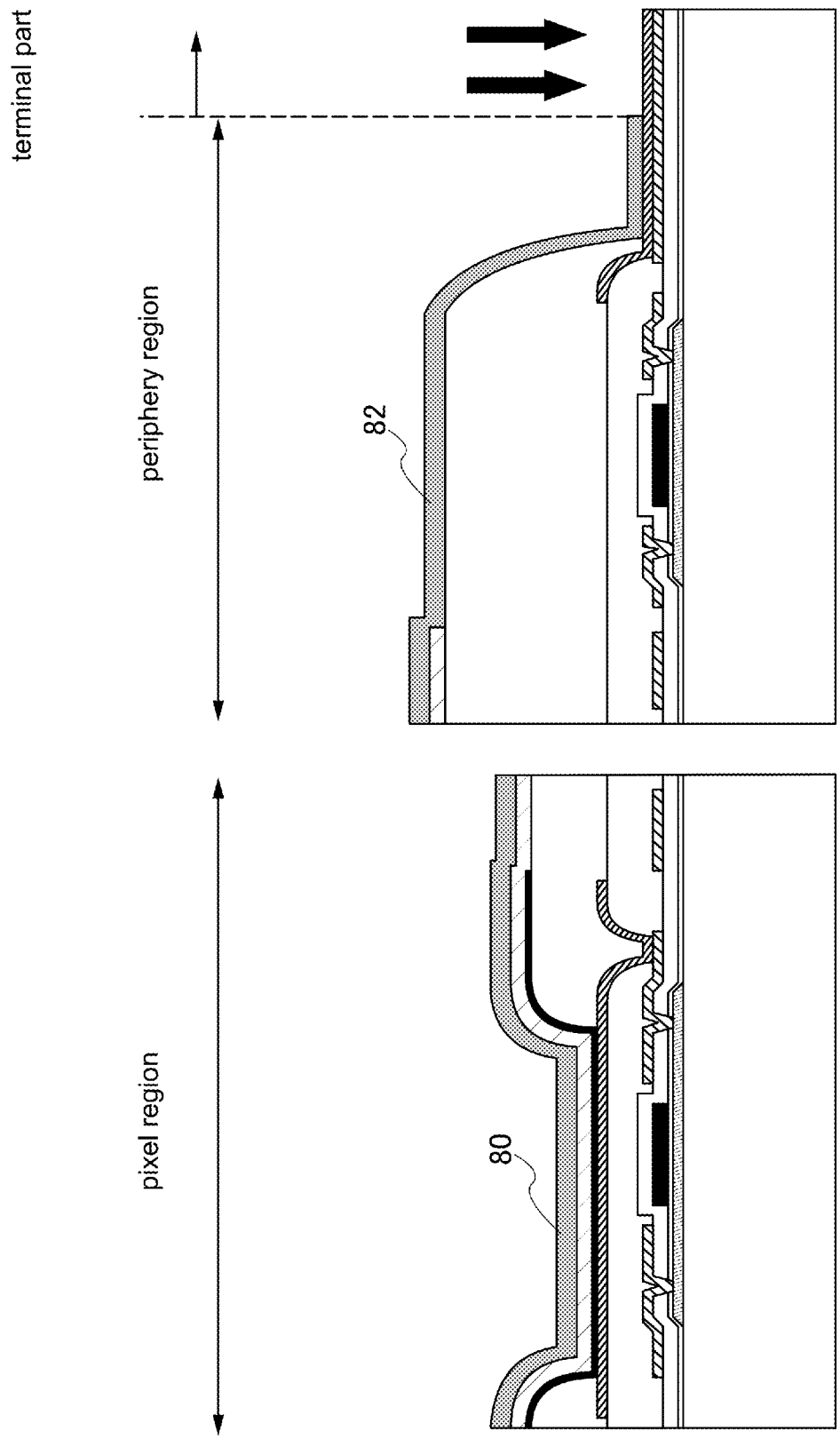
FIG. 13 is a cross-sectional process diagram of a transistor array substrate in embodiment one of the present invention.

In FIG. 13, sections of the protective film 82 corresponding to a terminal part are removed. Specifically, the terminal part corresponds to a position of the LSI chip 7 and FPC terminal part 8. Although the protective film may be removed by a photolithography process, because this process does not demand high alignment accuracy, removal may also be performed by a laser abrasion method. Laser abrasion refers to explosive peeling of a solid surface phase which accompanies plasma emission and impact noise due to evaporation or multiphoton absorption caused by absorption heat generated when irradiating a high strength, short pulse, short wavelength laser onto a surface of a solid such as an organic body or metal.

As described above, in embodiment one, it is possible to form the second insulation film 50 in the pixel region and the fourth insulation film 52 in the periphery region with different thicknesses using the same process without increasing the number of processes by using a multigradation mask. In this way, it is possible to reduce the effects of parasitic capacitance between the wiring 24 and common electrode 72 in the periphery region using the same number of processes as a conventional technique. As a result, it is possible to obtain the effects of a reduction in power consumption and high speed of a drive circuit when driving a circuit. In addition, in embodiment one, only the thickness of the second insulation layer in the periphery region is increased and the structure of the first insulation layer in the pixel region is not changed. That is, it is possible to reduce the effects of parasitic capacitance without affecting a display region.

(Embodiment Two)

Figure 14:
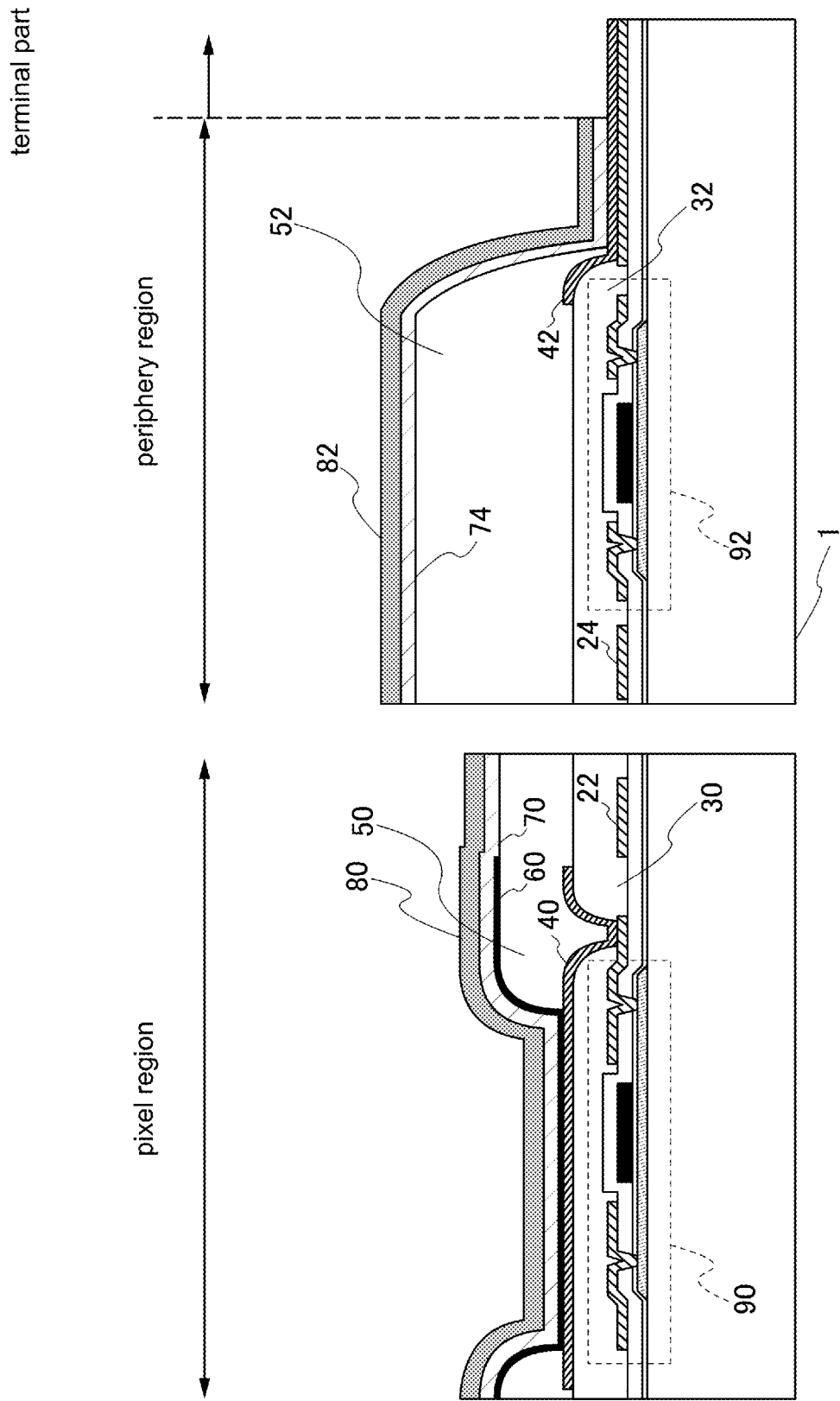
FIG. 14 is a cross-sectional schematic diagram of a transistor array substrate in embodiment two of the present invention.

A cross-sectional schematic diagram of a first substrate of a light emitting display device related to embodiment two of the present invention is shown in FIG. 14. In embodiment two, the points which are different from embodiment one are that a common electrode 74 of a periphery region is formed on the entire surface of a first substrate, and overlaps not only the second wiring 24 but also the transistor 92 of the periphery region. Because the remaining points are approximately the same as in embodiment one, an explanation of these points is omitted.

Conventionally, a common electrode is laid out so that the overlapping surface between a drive circuit and common electrode is reduced as much as possible in order to substantially reduce parasitic capacitance. In order to achieve this, efforts have been made to not form a common electrode on parts which overlap a drive circuit using a metal mask when forming the common electrode.

However, by making the thickness of second insulation layer including the third insulation film 32 and fourth insulation film 52 in the periphery region thicker than the first insulation layer including the first insulation film 30 and second insulation film 50 in the pixel region using embodiment one of the present invention, it becomes possible to reduce parasitic capacitance between the wiring arranged in the periphery region and between a drive circuit and common electrode. As a result, even if a common electrode is formed above a drive circuit, the operation of the circuit is almost not affected.

Therefore, there is no longer a need to use a metal mask when forming a common electrode and the effects of a reduction in processes and improvement in yield can be obtained. Furthermore, because an alignment mechanism of a metal mask is no longer required in a device for forming a common electrode and because it is possible to reduce cleaning costs of the metal mask itself, there are also cost reduction effects.

(Embodiment Three)

Figure 15:
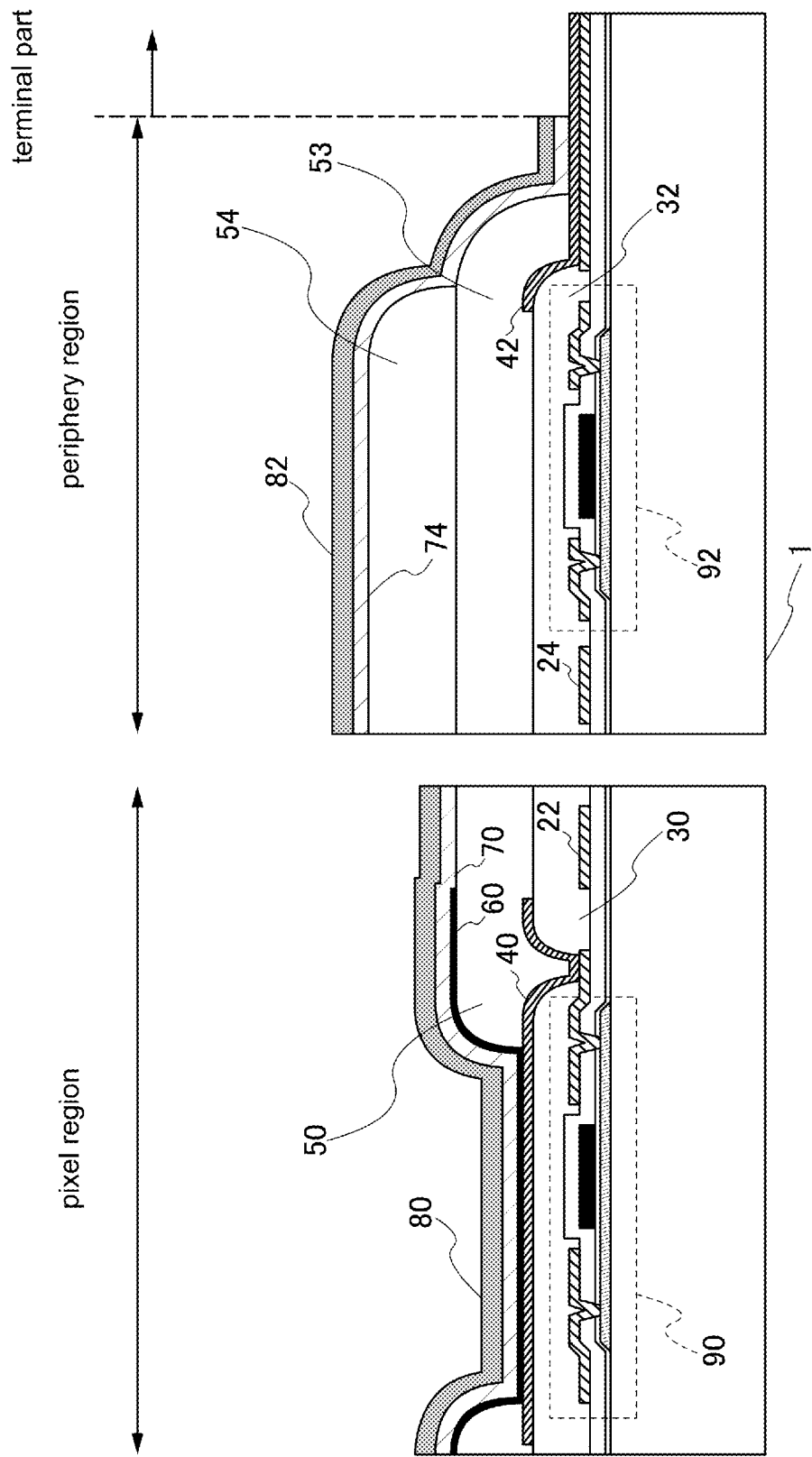
FIG. 15 is a cross-sectional schematic diagram of a transistor array substrate in embodiment three of the present invention.

A cross-sectional schematic diagram of a first substrate of a light emitting display device related to embodiment three of the present invention is shown in FIG. 15. In embodiment three, the points which are different from embodiment two are that a film corresponding to the second insulation film 50 in a pixel region and a film corresponding to the fourth insulation film 52 in a periphery region are formed by a process where a part is different. Because the remaining points are approximately the same as in embodiment two, an explanation of these points is omitted.

In embodiment three, exposure using a multigradation mask as in the process shown in FIG. 8 in embodiment one is not performed. First the second insulation film 50 in the pixel region and an insulation film 53 which is one part of the fourth insulation film in the periphery region are formed. Next, a photosensitive resin film is formed on the entire surface of the first substrate and an insulation film 54 which is one part of the fourth insulation film in a region where wiring and a drive circuit overlaps in the periphery region is formed. In this way, a film corresponding to the fourth insulation film 52 is formed using the insulation film 53 and insulation film 54.

As described above, by forming a film corresponding to the third insulation film in the pixel region and a film corresponding to the fourth insulation film in a periphery region using a process in which one part is different, it is possible to form the first substrate a second insulation layer including the third insulation film 32, insulation film 53 and insulation film 54 in the periphery region thicker compared to the first insulation layer including the first insulation film 30 and second insulation film 50 in the pixel region. Although the number of processes is larger compared to embodiment one and embodiment two, it is possible to use a conventional mask and exposure conditions. In addition, it is possible to accurately control the film thickness of the second insulation film 50 in the pixel region.

It is possible to reduce the effects of parasitic capacitance between wiring, a transistor and common electrode in a periphery region even in embodiment three. As a result, it is possible to obtain the effects of a reduction in power consumption when driving a circuit and high speed circuit driving.

Figure 16:
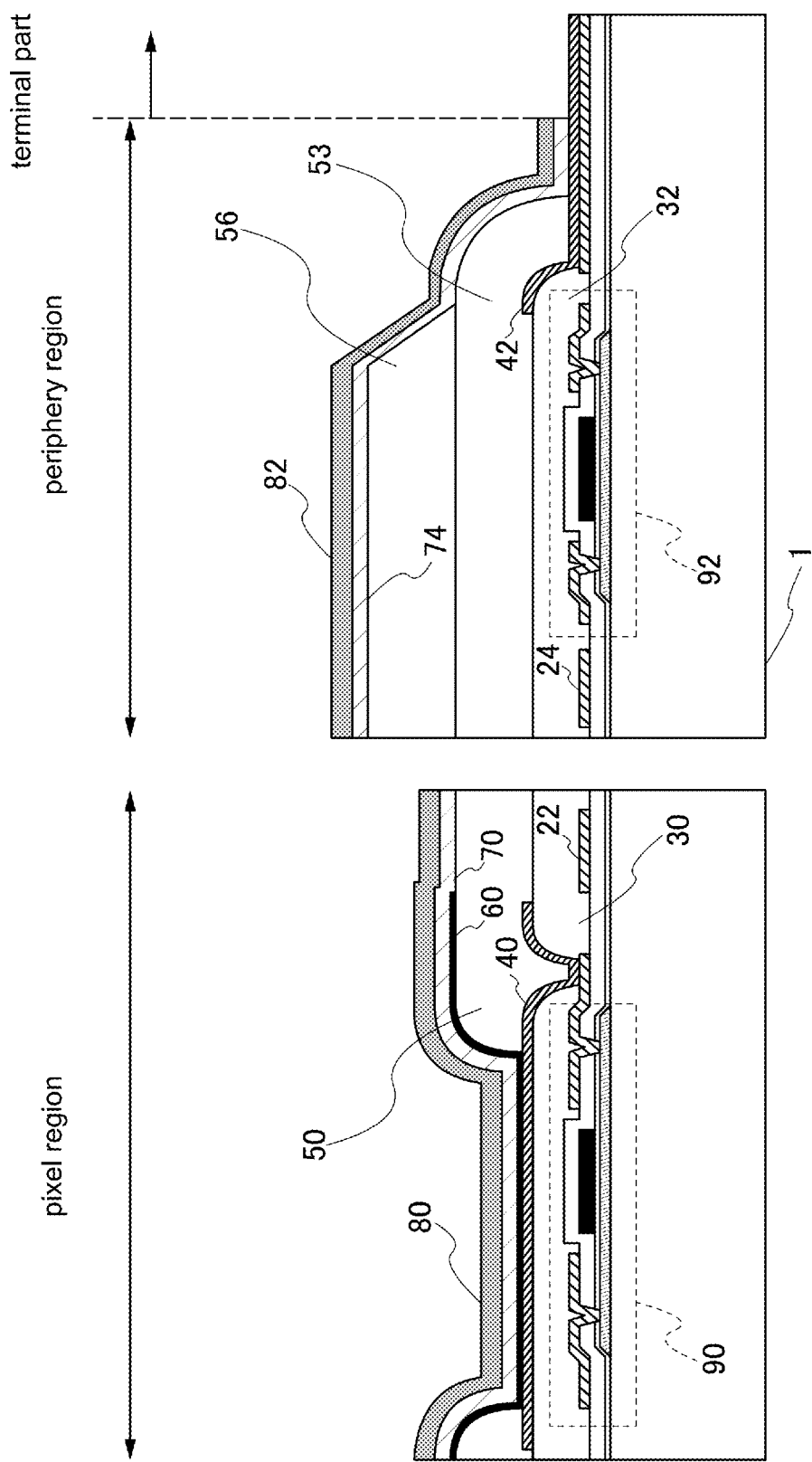
FIG. 16 is a modified example of a cross-sectional schematic diagram of a transistor array substrate in embodiment three of the present invention.

In embodiment three, although an example in which the same organic material resin film as the second insulation film 50 in the pixel region or the insulation film 53 which is one part of the fourth insulation film in the periphery region is used as the insulation film 54 which is one part of the fourth insulation film, this example is not limited to an organic resin film. An inorganic film 56 may also be used as shown in FIG. 16. By using an inorganic film for the insulation film 56 which is one part of the fourth insulation film, adhesion with a common electrode is improved and mechanical strength of a drive circuit part is improved.

Silicon oxide, silicon nitride, aluminum nitride, or aluminum oxide can be used as an inorganic material which can be used for the insulation film 56. Wet etching or dry etching can be used as a processing method of an inorganic film. FIG. 16 shows an example of processing using dry etching. Unlike the case where a photosensitive resin is used, the cross-sectional shape of an end part of a pattern is not round but has an angular shape. It is preferred that end part of a pattern of an organic film used for the insulation film 56 is a taper shape and it is preferable that the material of the photo resist and dry etching conditions are adjusted.

Figure 17:
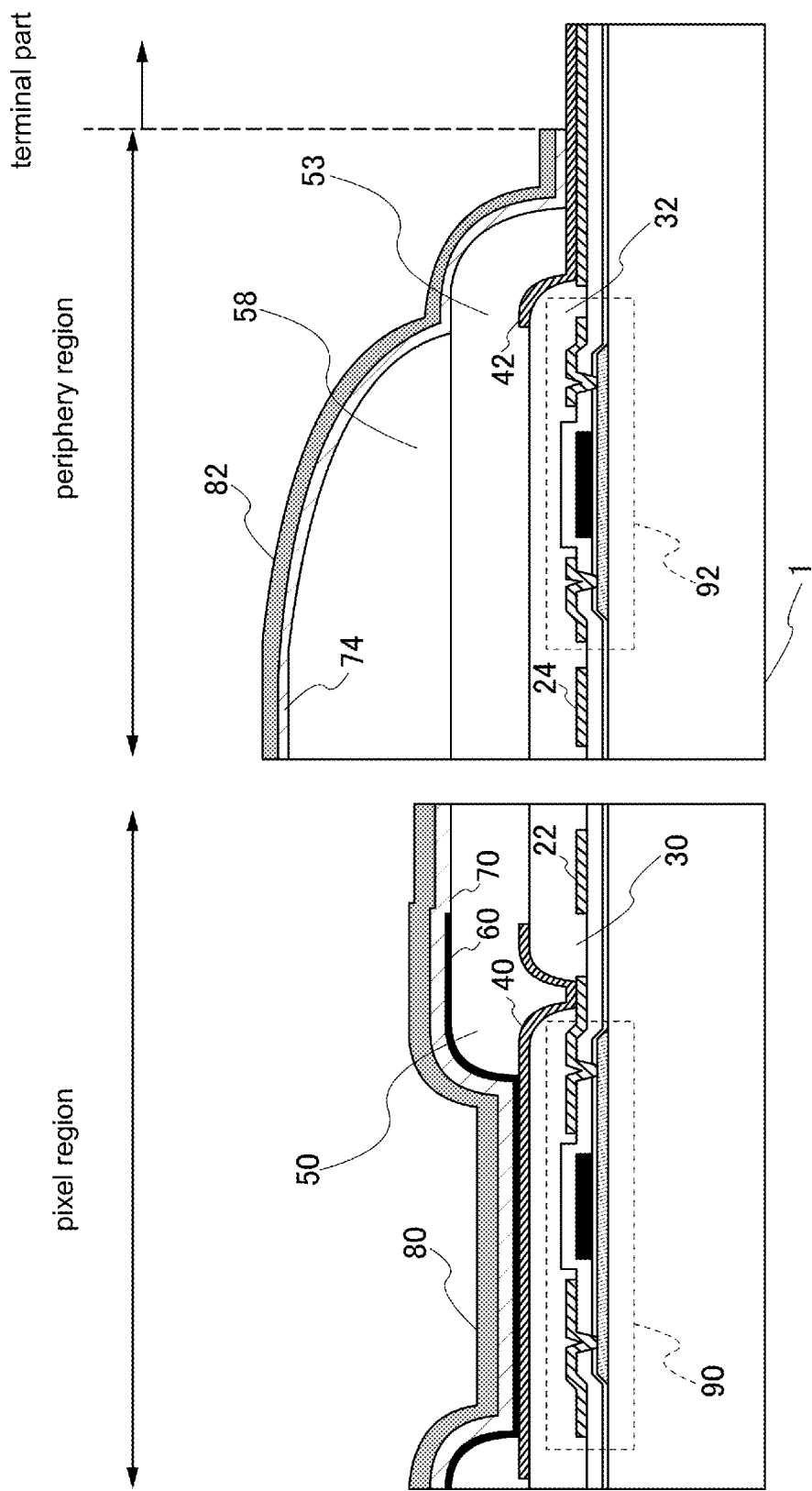
FIG. 17 is a modified example of a cross-sectional schematic diagram of a transistor array substrate in embodiment three of the present invention.

In addition, as another modified example, an insulation film 58 formed using an inkjet method may be used instead of the insulation film 54 which is one part of the fourth insulation film as is shown in FIG. 17. In the case of forming an insulation film using an inkjet method, it is easier to form a film thicker compared to coating using a spin coat method etc and it is possible to further reduce a taper angle.

There is an inkjet method whereby fine ink droplets are sprayed from an inkjet head, the droplets are impacted on required sections of the first substrate according to a device pattern and a liquid pattern including a functional material is drawn. Because the inkjet method can draw a pattern just on the required sections compared to a conventional all surface coating or film formation method, material can be saved.

Because it is possible to limit the sections formed to the sections where the effects of parasitic capacitance is to be reduced by adopting an inkjet method when forming the insulation film 58, it is possible to form the insulation film 58 with less material and with fewer processes.

A hydrophilic treatment and/or water repellent treatment may be performed on an organic solvent which is sprayed using an inkjet on a surface of the insulation film 53 which is one part of the fourth insulation film before spraying using the inkjet method. In this case, a hydrophilic treatment may be performed on section to be arranged with an insulation film and a water repellent treatment may be performed on the remaining sections. Because the material which is sprayed with the inkjet method spreads in hydrophilic regions and does not spread in water repellent regions, it is possible to accurately control the pattern of the insulation film 58. Because this method can accurately form a pattern even in the case where the capability of an inkjet mechanism is low, it is possible to adopt a simple inkjet device and reduce apparatus costs.

Figure 18:
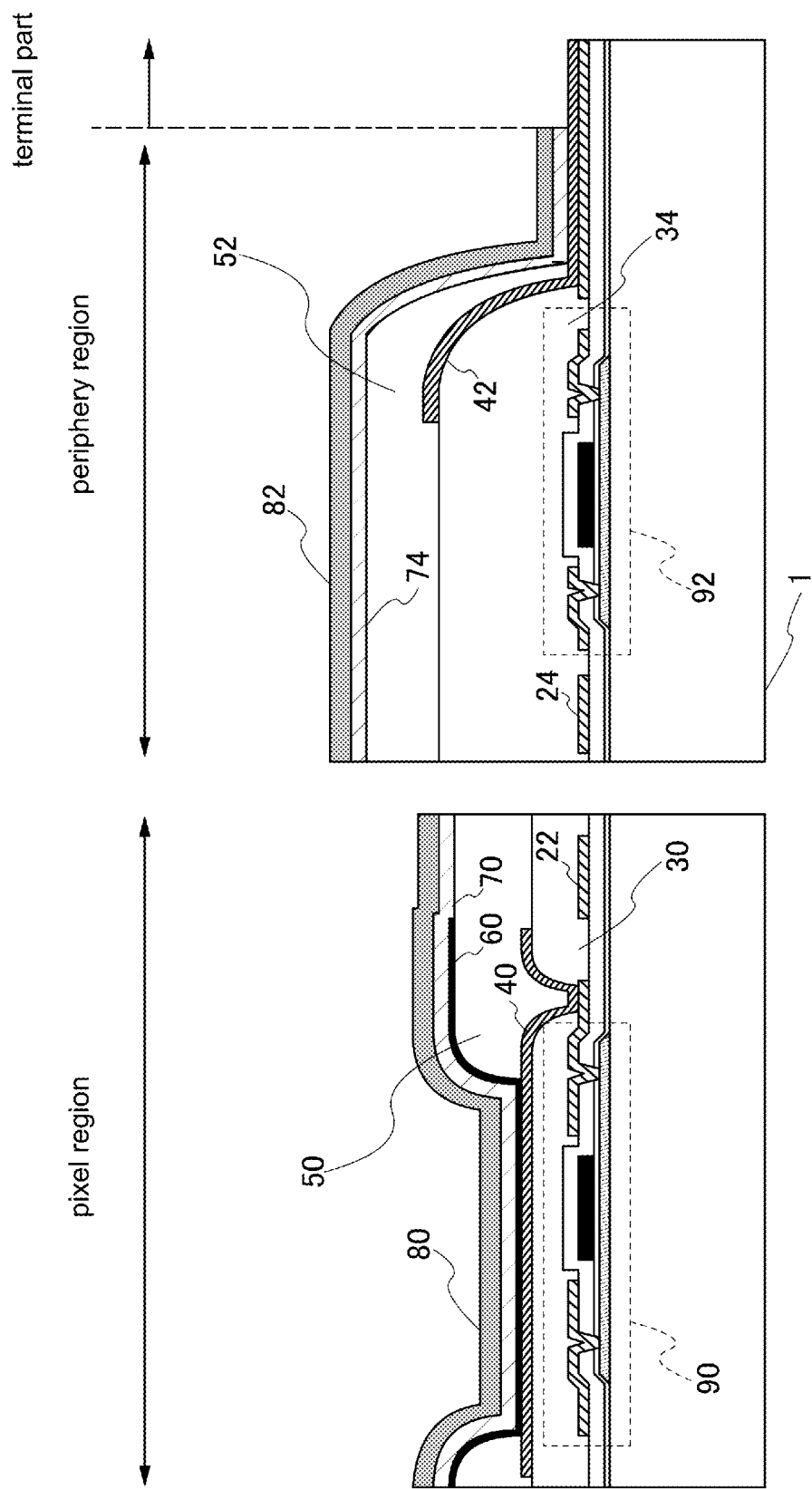
FIG. 18 is a modified example of a cross-sectional schematic diagram of a transistor array substrate in embodiment three of the present invention.

In addition, as another modified example, as is shown in FIG. 18, the film thickness of the second insulation layer including the third insulation film 34 and fourth insulation film 52 in a periphery region may be thicker than the film thickness of the first insulation layer including the first insulation film 30 and second insulation film 50 in a pixel region by making the film thickness of the third insulation film 34 in a periphery region thicker. It is possible to form the first insulation film 30 and third insulation film 34 with different thicknesses by used the multigradation mask described above. In addition, it is also possible to use an organic resin film stacked structure, an organic resin film and inorganic film stacked structure and a stacked structure of an organic resin film and insulation film formed using an inkjet method.

(Embodiment Four)

Figure 19:
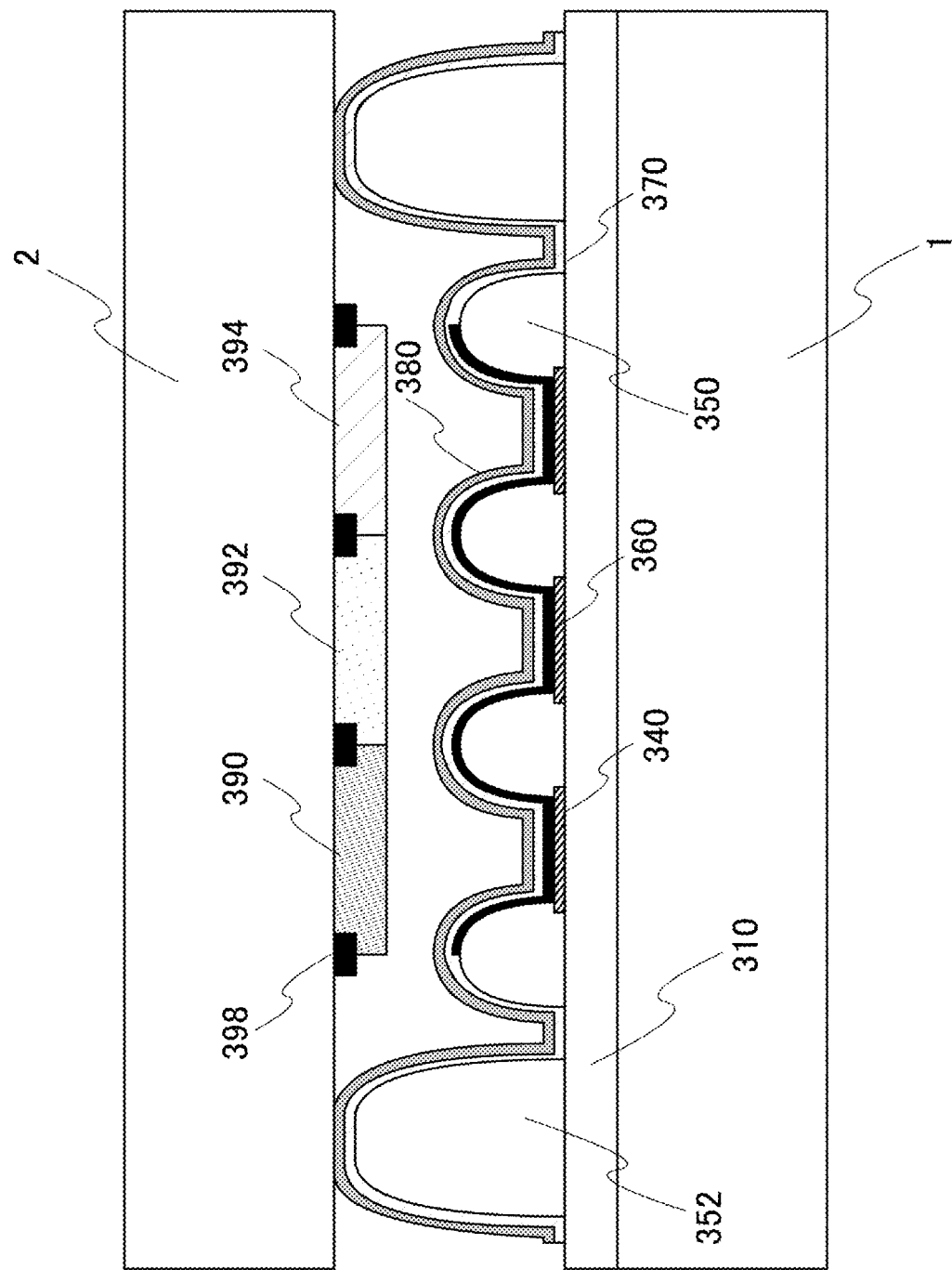
FIG. 19 is a cross-sectional schematic diagram of a transistor array substrate in embodiment four of the present invention.

A cross-sectional schematic diagram of a top emission type organic EL display in which a first substrate 1 in embodiment two and a second substrate 2 are bonded together is shown in FIG. 19. In FIG. 19, the first substrate 1 includes a transistor layer 310 (including an organic film above a source/drain electrode), a pixel electrode 340, a bank 350 including the second insulation film 50 formed between pixels in a pixel region, a convex part (bank) 352 including the fourth insulation film 52 formed at a thickness in order to relieve parasitic capacitance in a periphery region, a light emitting region 360, a common electrode 370 and a protective film 380.

In addition, in FIG. 19, the opposing electrode 2 includes color filters 390 (R), 392 (G) and 394 (B) corresponding to red (R), green (G) and blue (B) respectively, and a black matrix 398 for controlling mixing colors arranged between pixels. Each color filter is arranged corresponding to a light emitting region stacked with a pixel electrode 340 and light emitting layer 360 formed in the first substrate 1 and the black matrix 398 is arranged corresponding to an interval between each adjacent pixel. The width and thickness of the black matrix can be appropriately selected according to the characteristics demanded by each device.

The bank 352 is fixed to the second substrate 2 via an adhesive. In addition, it is possible to fix both using a filler material described herein instead of an adhesive.

In the conventional technology, a fixed interval is supported between the first substrate 1 and second substrate 2 via a dam (sealant) material arranged in a periphery region. However, in embodiment four, the bank 352 formed in a periphery region is thicker compared to the bank 350 formed in the pixel region. Therefore, in embodiment four, because it is possible to support a fixed interval between the first substrate 1 and second substrate 2 via the bank 352 formed in the periphery region, it is possible to omit a dam material.

In embodiment four, because it is possible to bond with good accuracy the first substrate 1 and second substrate 2 without using a dam material which was required in the conventional technology, the effects of a reduction in component costs, takt improvement and yield improvement due to a reduction in processes can be obtained.

Figure 20:
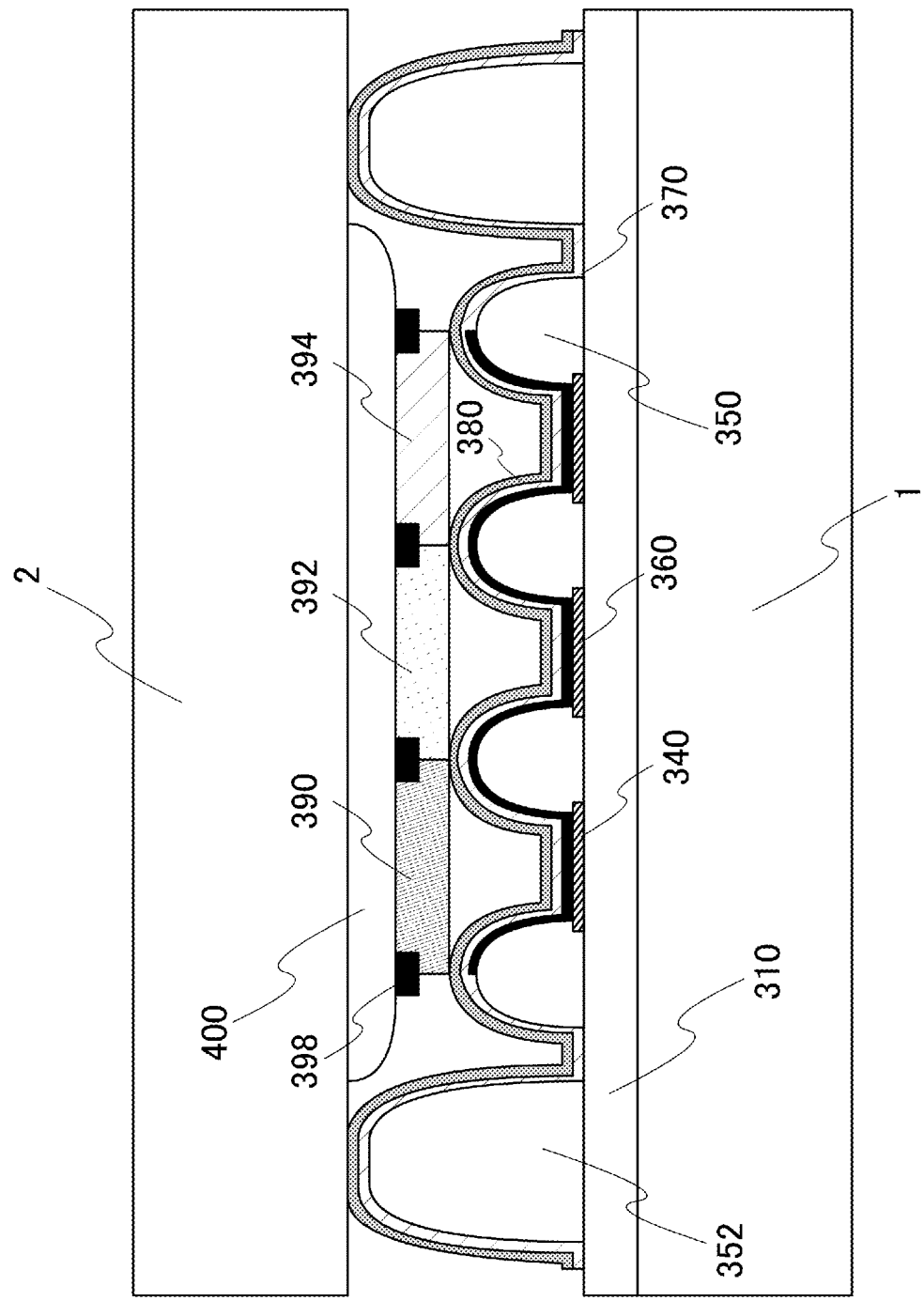
FIG. 20 is a modified example of a cross-sectional schematic diagram of a transistor array substrate in embodiment four of the present invention.

In addition, as another modified example, as is shown in FIG. 20, an overcoat film 400 may be arranged between the color filter, black matrix and the second substrate 2. The film thickness of the overcoat film 400 is preferred to be set to approximately match the difference in film thickness between the bank 350 and bank 352 and the total film thickness of the color filters 390, 392, 394 and the overcoat film 400. However, the film thickness difference between the bank 350 and bank 352 and the total film thickness of the color filters 390, 392, 394 and the overcoat film 400 do not have to match. It is sufficient that the film thickness of the overcoat film be set so that at least the total film thickness of the color filters 390, 392, 394 and the overcoat film 400 is smaller than the film thickness difference between the bank 350 and bank 352. Here, it is preferred that the overcoat film includes translucency.

By adopting the structure shown in FIG. 20, it is possible to bring the color filters 390, 392 and 394 closer to the light emitting layer 360. By reducing the gap between the light emitting layer and color filter, it is difficult for a light component in a diagonal direction emitted from a light emitting layer from leaking to an adjacent pixel and thereby it is difficult for colors to become mixed.

Figure 21:
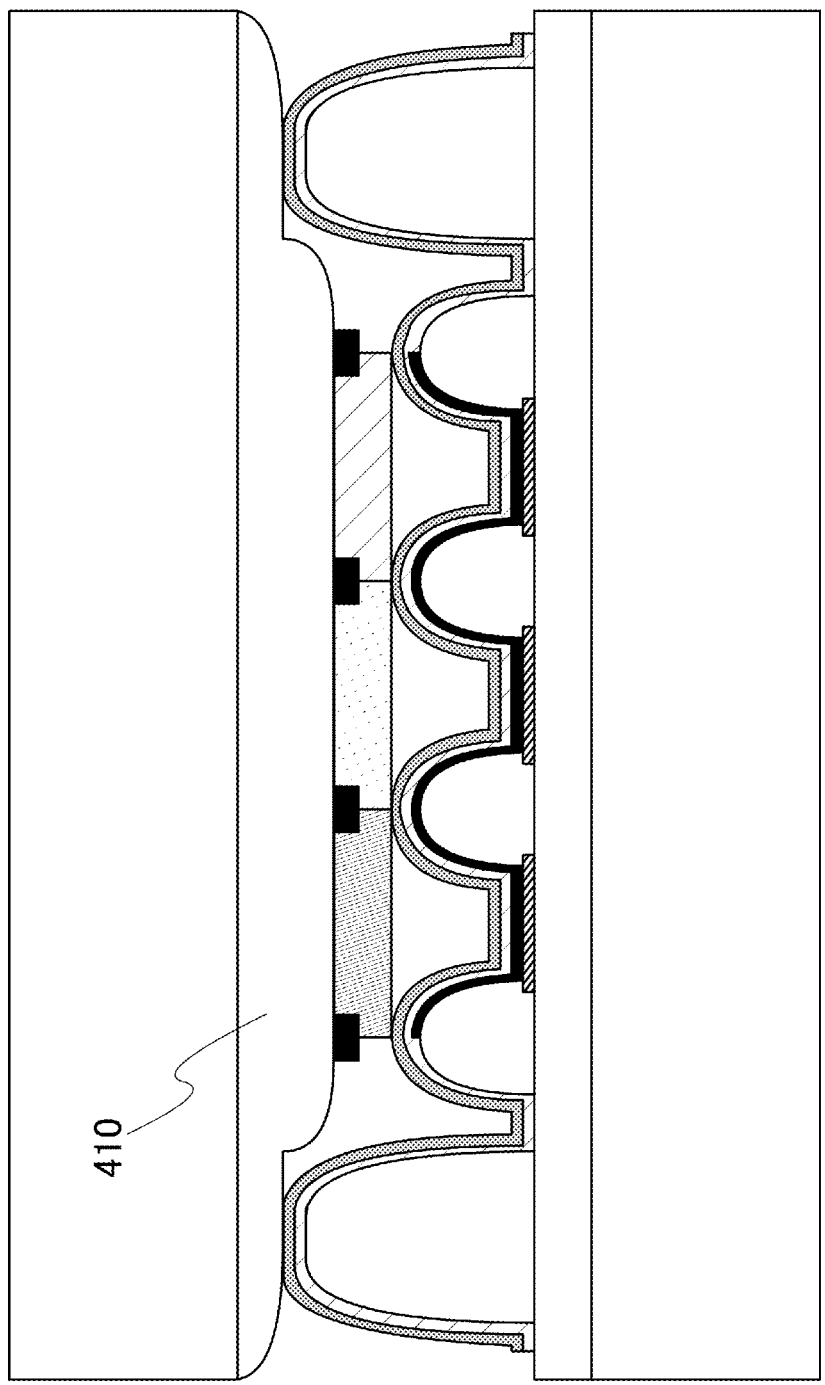
FIG. 21 is a modified example of a cross-sectional schematic diagram of a transistor array substrate in embodiment four of the present invention.

In addition, as another modified example, as is shown in FIG. 21, an overcoat film 410 may be used with a different film thickness between the pixel region and periphery region. The film thickness difference of the overcoat layer 410 between the pixel region and periphery region is preferred to be set to approximately match the film thickness difference between the bank 350 and bank 352 the same as described above and the total film thickness of the color filters 390, 392, 394 and overcoat film 400. However, the film thickness is not limited to those described above.

The overcoat film 410 can be formed by a multigradation mask if a photosensitive organic film is used. In addition, the overcoat film 410 may be formed by a plurality of exposure processes using different masks. In addition, the overcoat film 410 may be selectively formed in a position corresponding to a desired pattern using an inkjet.

By adopting the structure shown in FIG. 21, a protective film is fixed with the overcoat film 410 above the bank 352 when bonding the first substrate 1 and second substrate 2 together. Because the overcoat film 410 functions as a buffer for relieving pressure when bonding, it is possible to control substrate damage or cracks in the protective film.

Figure 22:
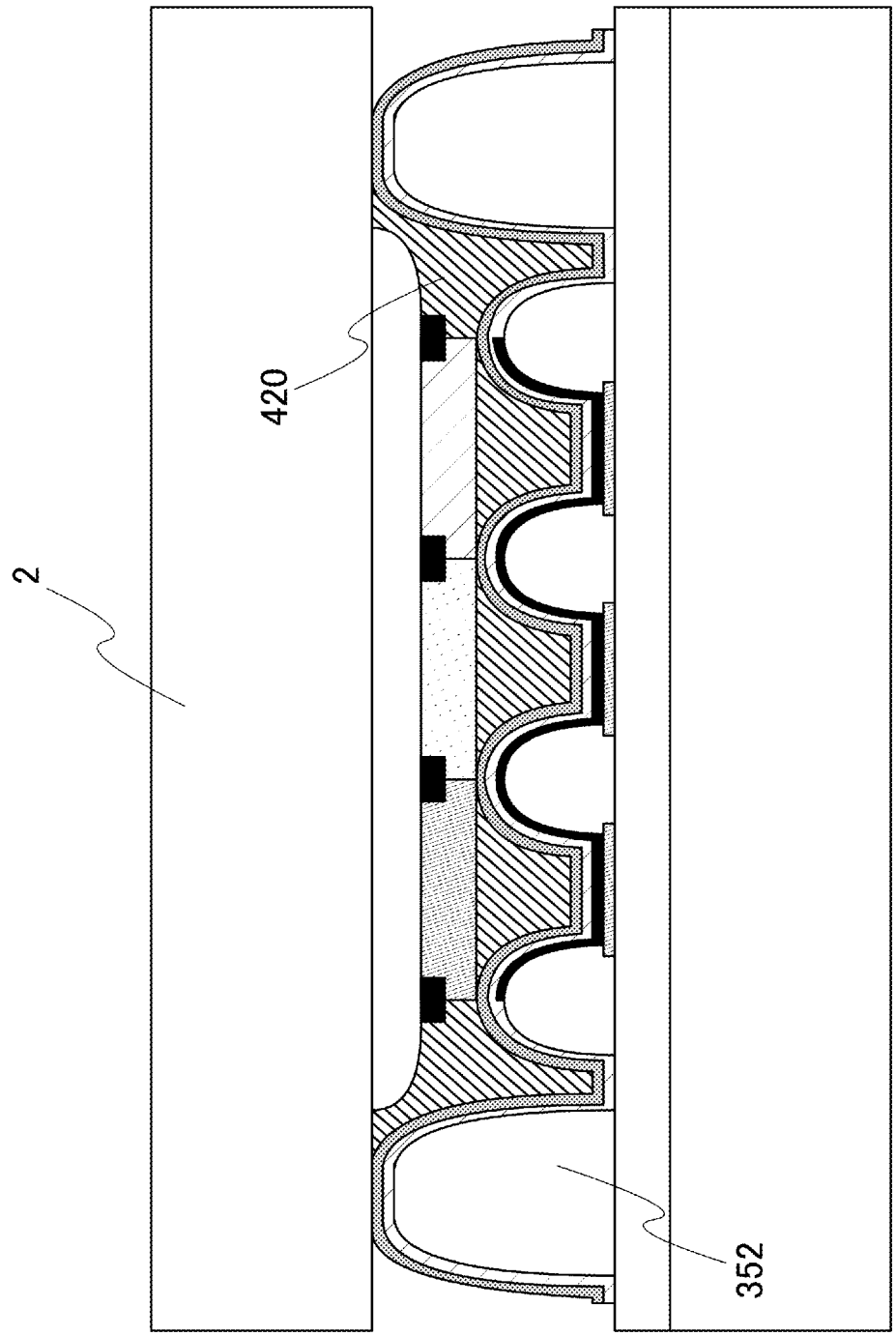
FIG. 22 is a modified example of a cross-sectional schematic diagram of a transistor array substrate in embodiment four of the present invention.

In addition, as another modified example, as is shown in FIG. 22, a filler material 42 may be introduced into a space enclosed by the first substrate 1, second substrate 2 and bank 352. The filler material 420 is preferred to be filled into the space without any gaps. In addition, it is preferable that it is difficult for bubbles to be generated in the filler material 420 and have a high level of barrier properties to a water component. In addition, it is more preferable that the filler material 420 have high translucency with respect to a top emission type EL display.

In addition, as described previously, a part of the filler material 420 between the bank 352 and second substrate 2 may be used as an adhesive when bonding the first substrate 1 and second substrate 2. In this case, because it is not necessary to coat an adhesive and it is possible to provide a self-aligning filler material on an adhesive surface, the effects of takt improvement and improvement in yield due to a reduction in processes can be obtained.

As described above, by making the film thickness of an insulation layer in a periphery region thicker compared to the film thickness of an insulation layer in a pixel region and thereby reducing the effects of parasitic capacitance in the periphery region, it is possible to reduce power consumption of a light emitting display device. In addition, by bringing a color filter arranged on the side of a second substrate closer to a light emitting layer on the first substrate, it is possible to obtain a high quality light emitting display device with less color mixing.

Furthermore, the present invention is not limited to the embodiments described above and can be appropriately changed within a range that does not depart from the spirit of the invention.

What is claimed is:

1. A light emitting display device comprising:
an insulation film arranged above a first substrate;
a first wiring arranged above the insulation film in a pixel region, the pixel region including pixels;
a second wiring arranged above the insulation film in a periphery region surrounding the pixel region, wherein the periphery region does not include a pixel, and the first and the second wirings are located at a same layer;
a common electrode continuously arranged over the pixels and continuously extending from the pixel region to the periphery region;
pixel electrodes each included in each of the pixels and located between the common electrode and the first wiring;
a first insulation layer arranged between the first wiring and the common electrode, the first insulation layer including an area located between the common electrode and at least one of the pixel electrodes; and a second insulation layer arranged between the second wiring and the common electrode and having a larger thickness than the first insulation layer, wherein a first distance between the second wiring and the common electrode via the second insulation layer in the periphery region is larger than a second distance between the first wiring and the common electrode via the first insulation layer in the pixel region, and the first and second distances are in a direction perpendicular to a main surface of the first substrate.

2. The light emitting display device according to claim 1, wherein the common electrode is arranged to overlap a drive circuit arranged in the periphery region.

3. The light emitting display device according to claim 1, wherein the first insulation layer includes a first insulation film and a second insulation film arranged above the first insulation film, and the second insulation layer includes a third insulation film and a fourth insulation film arranged above the third insulation film, wherein the second insulation film is located between the common electrode and the at least one of the pixel electrodes, and covers an end portion of the at least one of the pixel electrodes, and wherein the fourth insulation film is thicker than the second insulation film.

4. The light emitting display device according to claim 3, wherein the second insulation film is formed by the same process as the fourth insulation film.

5. The light emitting display device according to claim 3, wherein at least a part of the second insulation film and the fourth insulation film is formed by a different process.

6. The light emitting display device according to claim 5, wherein at least a part of the fourth insulation film is formed by an inkjet method.

7. The light emitting display device according to claim 5, wherein the fourth insulation film is a stacked structure of an organic film and an inorganic film.

8. The light emitting display device according to claim 3, further comprising:
a second substrate facing the first substrate; and
a color filter arranged between the pixel and the second substrate.

9. The light emitting display device according to claim 8, further comprising:
a film having translucency between the second substrate and the color filter in the pixel region;
wherein
the color filter is arranged closer to the first substrate than a position where at least a convex part including the fourth film contacts the second substrate in the periphery region.

10. The light emitting display device according to claim 9, wherein the convex part is fixed to the second substrate via an adhesive.

11. The light emitting display device according to claim 9, further comprising:
a filler material present in a space closed by the first substrate, the second substrate and the convex part.

12. A manufacturing method of a light emitting display device comprising:
forming an insulation film above a first substrate;
forming a first wiring above the insulation film in a pixel region, the pixel region including pixels;
forming a second wiring above the insulation film in a periphery region surrounding the pixel region, the periphery region not including a pixel, the first and second wiring located at a same layer;
forming pixel electrodes above the first wiring, each of the pixel electrodes included in each of the pixels;
forming a first insulation layer above the first wiring;
forming a second insulation layer thicker than the first insulation layer above the second wiring; and
forming a common electrode continuously extending from the pixel region to the periphery region above the first insulation layer and the second insulation layer,
wherein the first insulation layer includes an area located between the common electrode and one of the pixel electrodes, and
a first distance between the second wiring and the common electrode via the second insulation layer in the periphery region is larger than a second distance between the first wiring and the common electrode via the first insulation layer in the pixel region, and the first and the second distances are in a direction perpendicular to a main surface of the first substrate.

13. The manufacturing method of a light emitting display device according to claim 12, wherein the first insulation layer includes a first insulation film and a second insulation film, the first insulation film is formed above the first wiring, and the second insulation film is formed above the first insulation film, wherein the second insulation layer includes a third insulation film and a fourth insulation film thicker than the second insulation film, the third insulation film is formed above the second wiring, and the fourth insulation film is formed above the third insulation film, wherein the second insulation film is located between the common electrode and at least one of the pixel electrodes, and covers an end portion of the at least one of the pixel electrodes, and wherein the second insulation film and the fourth insulation film are formed by the same process by exposure using a multi-gradation mask.

14. The manufacturing method of a light emitting display device according to claim 12, wherein the first insulation layer includes a first insulation film and a second insulation film, the first insulation film is formed above the first wiring, and the second insulation film is formed above the first insulation film, wherein the second insulation layer includes a third insulation film and a fourth insulation film thicker than the second insulation film, the third insulation film is formed above the second wiring, and the fourth insulation film is formed above the third insulation film, wherein the second insulation film and the fourth insulation film are formed by exposure a plurality of times.

15. The manufacturing method of a light emitting display device according to claim 12, wherein the first insulation layer includes a first insulation film and a second insulation film, the first insulation film is formed above the first wiring, and the second insulation film is formed above the first insulation film, wherein the second insulation layer includes a third insulation film and a fourth insulation film thicker than the second insulation film, the third insulation film is formed above the second wiring, and the fourth insulation film is formed above the third insulation film, wherein the fourth insulation film is formed by an inkjet method.

16. The light emitting display device according to claim 1, wherein the common electrode has a first uppermost surface on the first insulation layer in the pixel region and a second uppermost surface on the second insulation layer in the periphery region, and
a distance between the second wiring and the second uppermost surface is larger than a distance between the first wiring and the first uppermost surface.

17. The light emitting display device according to claim 1, further comprising a light emitting layer being between the common electrode and the pixel electrodes.

18. The light emitting display device according to claim 1, wherein the first wiring and the second wiring are in contact with the insulation film.

19. The manufacturing method of a light emitting display device according to claim 12, wherein the first wiring and the second wiring are in contact with the insulation film.

* * * * *